United States Patent
Park et al.

(10) Patent No.: US 11,589,687 B2
(45) Date of Patent: Feb. 28, 2023

(54) REFRIGERATOR HAVING PANEL ASSEMBLY COVERING OPENING OF OUTER PLATE OF DOOR

(71) Applicant: LG ELECTRONICS INC., Seoul (KR)

(72) Inventors: Jisu Park, Seoul (KR); Taehoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/557,536

(22) Filed: Dec. 21, 2021

(65) Prior Publication Data

US 2022/0113079 A1    Apr. 14, 2022

Related U.S. Application Data

(63) Continuation of application No. 16/781,143, filed on Feb. 4, 2020, now Pat. No. 11,300,350, which is a (Continued)

(30) Foreign Application Priority Data

Jan. 5, 2016 (KR) ...................... 10- 2016-0001298

(51) Int. Cl.
*A47F 3/04* (2006.01)
*F25D 23/02* (2006.01)
(Continued)

(52) U.S. Cl.
CPC ............ *A47F 3/0434* (2013.01); *A47F 3/001* (2013.01); *F21V 3/00* (2013.01); *F21V 7/0008* (2013.01);
(Continued)

(58) Field of Classification Search
CPC ........ A47F 3/0434; A47F 3/001; F21V 29/89; F21V 23/002; F21V 23/0442;
(Continued)

(56) References Cited

U.S. PATENT DOCUMENTS 2,131,680 A    9/1938  Zahodiakin
6,059,420 A    5/2000  Rogers
(Continued)

FOREIGN PATENT DOCUMENTS

CN    102519204    6/2012
CN    102741919    10/2012
(Continued)

OTHER PUBLICATIONS

U.S. Notice of Allowance issued in U.S. Appl. No. 16/781,143 dated Feb. 25, 2022.
(Continued)

*Primary Examiner* — Andrew J Coughlin
*Assistant Examiner* — Jessica M Apenteng
(74) *Attorney, Agent, or Firm* — Ked & Associates, LLP

(57) ABSTRACT

Provided is a refrigerator. The refrigerator is characterized by enabling at least a part of a refrigerator door to be selectively transparent by a user's operation, such that the user sees through an inside of the refrigerator while the refrigerator door is closed.

20 Claims, 37 Drawing Sheets

Related U.S. Application Data continuation of application No. 16/416,498, filed on May 20, 2019, now Pat. No. 10,588,428, which is a continuation of application No. 15/340,056, filed on Nov. 1, 2016, now Pat. No. 10,342,363.

(51) Int. Cl.

| | | |
|---|---|---|
| *F25D 27/00* | (2006.01) | |
| *H05B 47/12* | (2020.01) | |
| *F21V 3/00* | (2015.01) | |
| *F21V 23/04* | (2006.01) | |
| *F25D 29/00* | (2006.01) | |
| *G10L 21/0232* | (2013.01) | |
| *H04R 1/02* | (2006.01) | |
| *H04R 1/04* | (2006.01) | |
| *F21V 29/89* | (2015.01) | |
| *A47F 3/00* | (2006.01) | |
| *F21V 7/00* | (2006.01) | |
| *F21V 15/01* | (2006.01) | |
| *F21V 23/00* | (2015.01) | |
| *F25D 11/02* | (2006.01) | |
| *F25D 23/04* | (2006.01) | |
| *F25D 31/00* | (2006.01) | |
| *G02B 27/14* | (2006.01) | |
| *E05D 11/00* | (2006.01) | |
| *G01H 1/00* | (2006.01) | |
| *F21Y 115/10* | (2016.01) | |
| *H05B 47/105* | (2020.01) | |
| *F21W 131/305* | (2006.01) | |

(52) U.S. Cl.
CPC ............ *F21V 15/01* (2013.01); *F21V 23/002* (2013.01); *F21V 23/0442* (2013.01); *F21V 23/0471* (2013.01); *F21V 29/89* (2015.01); *F25D 11/02* (2013.01); *F25D 23/02* (2013.01); *F25D 23/025* (2013.01); *F25D 23/028* (2013.01); *F25D 23/04* (2013.01); *F25D 27/00* (2013.01); *F25D 27/005* (2013.01); *F25D 29/00* (2013.01); *F25D 29/005* (2013.01); *F25D 31/005* (2013.01); *G02B 27/144* (2013.01); *G10L 21/0232* (2013.01); *H04R 1/028* (2013.01); *H04R 1/04* (2013.01); *H05B 47/12* (2020.01); *E05D 11/0054* (2013.01); *E05D 11/0081* (2013.01); *E05Y 2900/31* (2013.01); *F21W 2131/305* (2013.01); *F21Y 2115/10* (2016.08); *F25D 2323/023* (2013.01); *F25D 2400/18* (2013.01); *F25D 2700/00* (2013.01); *F25D 2700/04* (2013.01); *G01H 1/00* (2013.01); *H03K 2217/94005* (2013.01); *H03K 2217/96011* (2013.01); *H05B 47/105* (2020.01)

(58) Field of Classification Search
CPC .... F21V 23/0471; F21V 7/0008; F21V 15/01; F25D 11/02; F25D 11/025; F25D 11/028; F25D 11/04; F25D 2323/023; H05B 47/12; F21Y 2115/10; H04R 1/028; H04R 1/04
See application file for complete search history.

(56) References Cited

U.S. PATENT DOCUMENTS

| 7,805,892 | B2 | 10/2010 | Neumann et al. | |
|---|---|---|---|---|
| 9,702,619 | B2 | 7/2017 | Kendall | |
| 9,791,207 | B2 * | 10/2017 | Kim | F25D 23/028 |
| 10,222,117 | B2 | 3/2019 | Seo | |
| 10,228,182 | B2 | 3/2019 | Choi et al. | |
| 2002/0046749 | A1 | 4/2002 | Leutner | |
| 2010/0024466 | A1 * | 2/2010 | Kwon | F25D 11/02 |
| | | | | 62/449 |
| 2011/0134627 | A1 | 6/2011 | Hamlin et al. | |
| 2012/0007836 | A1 | 1/2012 | Wu et al. | |
| 2012/0061405 | A1 | 3/2012 | Kwon | |
| 2014/0011133 | A1 | 1/2014 | Liu et al. | |
| 2014/0111333 | A1 | 4/2014 | Haas | |
| 2015/0035432 | A1 | 2/2015 | Kendall et al. | |
| 2015/0228253 | A1 | 8/2015 | Lee et al. | |
| 2016/0290658 | A1 | 10/2016 | Phillips | |
| 2017/0176087 | A1 * | 6/2017 | Kang | F25D 23/025 |
| 2017/0188721 | A1 * | 7/2017 | Park | F21V 3/00 |
| 2017/0191745 | A1 * | 7/2017 | Choi | F25D 23/028 |
| 2017/0211874 | A1 * | 7/2017 | Kim | G01H 1/00 |
| 2017/0234601 | A1 * | 8/2017 | Basso | G07F 11/28 |
| | | | | 312/404 |
| 2017/0292768 | A1 * | 10/2017 | Yang | F25D 23/061 |
| 2017/0370634 | A1 * | 12/2017 | Kim | F25D 23/028 |
| 2018/0142943 | A1 * | 5/2018 | Haney | F25D 25/025 |
| 2018/0142946 | A1 * | 5/2018 | Akalan | F24C 15/30 |
| 2018/0149420 | A1 * | 5/2018 | Lee | H05K 5/0017 |

FOREIGN PATENT DOCUMENTS

| CN | 202734419 | 2/2013 |
|---|---|---|
| EP | 3 086 061 | 10/2016 |
| JP | H01-174877 | 7/1989 |
| JP | 02892781 | 5/1999 |
| JP | 3061805 | 7/2000 |
| JP | 2004-225968 | 8/2004 |
| JP | 2008-522122 | 6/2008 |
| JP | 2011-163639 | 8/2011 |
| KR | 20-1999-0015883 | 5/1999 |
| KR | 20-0174778 | 3/2003 |
| KR | 10-2004-0085325 | 10/2004 |
| KR | 10-2007-0061885 | 6/2007 |
| KR | WO 2007/115587 | 10/2007 |
| KR | 10-0804608 | 2/2008 |
| KR | 10-2011-0089534 | 8/2011 |
| KR | 10-2011-0090739 | 8/2011 |
| KR | 10-2012-0115615 | 10/2012 |
| KR | WO 2012/154236 | 11/2012 |
| KR | 10-2013-0027101 | 3/2013 |
| KR | 10-2013-0072186 | 7/2013 |
| KR | 10-2013-0115586 | 10/2013 |
| KR | 10-2014-0060431 | 5/2014 |
| KR | WO 2014/175639 | 10/2014 |
| KR | 10-2014-0127589 | 11/2014 |
| KR | 10-2014-0128098 | 11/2014 |
| KR | 10-2015-0016683 | 2/2015 |
| KR | 10-2015-0123493 | 11/2015 |
| KR | WO 2016/175562 | 11/2016 |

OTHER PUBLICATIONS

European Extended Search Report in European Application No. 16200271.1 dated Apr. 18, 2017, 10 pages.
U.S. Office Action issued in U.S. Appl. No. 15/340,056 dated Oct. 22, 2018.
U.S. Office Action issued in U.S. Appl. No. 16/146,498 dated Jul. 9, 2019.
Korean Notice of Allowance dated Oct. 11, 2019.
U.S. Notice of Allowance issued in U.S. Appl. No. 16/146,498 dated Nov. 4, 2019.
Korean Office Action dated Apr. 8, 2021.
U.S. Notice of Allowance in U.S. Appl. No. 16/781,143 dated Oct. 4, 2021.
Korean Office Action dated Dec. 16, 2022 issued in Application No. 10-2022-0119184.

* cited by examiner

REFRIGERATOR HAVING PANEL ASSEMBLY COVERING OPENING OF OUTER PLATE OF DOOR

CROSS-REFERENCE TO RELATED APPLICATIONS

This application is a Continuation application of U.S. patent application Ser. No. 16/781,143 filed Feb. 4, 2020, which is a continuation of prior U.S. patent application Ser. No. 16/416,498 filed May 20, 2019, now U.S. Pat. No. 10,588,428, which is a continuation of U.S. patent application Ser. No. 15/340,056 filed Nov. 1, 2016, now U.S. Pat. No. 10,342,363, which claims priority under 35 U.S.C. § 119 to Korean Application No. 10-2016-0001298 filed on Jan. 5, 2016, whose entire disclosures are hereby incorporated by reference.

BACKGROUND

Generally, a refrigerator is a home appliance which stores food at a low temperature in a storage space. The refrigerator is formed to cool an inside of the storage space using cooling air generated through heat exchange with a refrigerant circulated in a refrigeration cycle, and keeps the stored food in an optimum state.

SUMMARY

The present invention is directed to a refrigerator which enables at least a part of a refrigerator door to be selectively transparent by an user's operation, such that the user sees through an inside of the refrigerator while the refrigerator door is closed.

Also, the present invention is directed to a refrigerator in which at least a part of a front surface of a refrigerator door is formed of half glass, and a lighting unit in the refrigerator is turned on/off by a user's operation, and thus the user sees through an inside of the refrigerator while the refrigerator door is closed.

Also, the present invention is directed to a refrigerator which uniformly illuminates an entire opening part when a lighting unit is turned on.

Also, the present invention is directed to a refrigerator which is selectively transparent by a knocking operation on a refrigerator door, and enables an inside of the refrigerator to be visible.

Also, the present invention is directed to a refrigerator which enhances recognition performance and reliability of an operation for enabling an inside of the refrigerator to be visible through a panel assembly while a refrigerator door is closed.

Also, the present invention is directed to a refrigerator which prevents exposure of a detection device detecting an operation for enabling at least a part of a refrigerator door to be selectively transparent.

Also, the present invention is directed to a refrigerator in which a detection device for detecting a user's operation is easily installed and assembled, and maintenance thereof is easily performed.

Also, the present invention is directed to a refrigerator which is able to prevent dew condensation on a surface of a refrigerator door formed of a glass material and enabling an inside of the refrigerator to be seen through.

Also, the present invention is directed to a refrigerator which enables a panel plate formed of a glass material to be firmly installed and fixed to a door, and also enables a step difference or a gap in an installed state to be minimized.

Also, the present invention is directed to a refrigerator which enables an insulation to be completely filled in an inside of a door.

Also, the present invention is directed to a refrigerator which easily guides an electric wire inside a door, and prevents interference when the door is rotated.

Also, the present invention is directed to a refrigerator in which an internal space of a door basket is able to be utilized variously.

According to an aspect of the present invention, there is provided a refrigerator including a cabinet configured to form a storage space; a main door configured to open and store the storage space, and having an opening part which is in communication with the storage space; a sub-door rotatably installed at the main door and configured to open and close the opening part; a panel assembly provided at the sub-door, and having a half-mirror structure which allows to selectively see through an inside of the opening part; a knock detection device disposed at a rear surface of the panel assembly, and configured to detect a user' knocking operation on the panel assembly; and a door lighting unit provided above the panel assembly, turned on or off by the knock detection device to selectively illuminate an internal space of the opening part, such that the panel assembly selectively becomes transparent.

The sub-door may include an outer plate which is formed of a metal plate material, forms an exterior of the sub-door and has a panel installation opening at which the panel assembly is installed; a door liner which is spaced apart from the outer plate, forms a perimeter of a rear surface of the sub-door, and forms a space, in which an insulation is filled, at an outside of the panel assembly; an upper cap decoration which is coupled to upper ends of the outer plate and the door liner, and forms an upper surface of the sub-door; and a lower cap decoration which is coupled to lower ends of the outer plate and the door liner, and forms a lower surface of the sub-door.

A support frame which supports the outer plate and the panel assembly may be formed at a perimeter of the panel installation opening.

A plate insertion part in which a plate bent part bent along the perimeter of the penal installation opening is accommodated may be formed at the support frame.

A plurality of protrusions may be formed at an inside of the plate insertion part, and a plate hole in which the plurality of protrusions are inserted may be formed at the plate bent part.

A plurality of holes through which a foaming solution is introduced may be formed along the plate insertion part.

The holes may be formed at positions corresponding to the protrusions.

The plate bent part may be in close contact with a side end of the panel assembly.

The support frame may be bonded to the rear surface of the panel assembly.

A heater groove in which a heater disposed along an edge of the panel assembly is accommodated may be formed at the support frame.

An aluminum sheet may be interposed between the support frame and the panel assembly.

The support frame may include an upper frame which accommodates an upper end of the panel installation opening, side frames which accommodate both side ends of the panel installation opening; and a lower frame which accommodates a lower end of the panel installation opening, and the upper frame, the side frames and the lower frame may be coupled to each other.

A detection device hole through which a front end of the knock detection device passes may be formed at the lower frame.

An upper hinge installation part to which an upper hinge connecting the main door with the cabinet is shaft-coupled may be formed at an upper end of the main door, and a sub-upper hinge installation part to which a sub-upper hinge connecting the sub-door with the cabinet is shaft-coupled may be formed at an upper end of the sub-door, and a hinge shaft of the sub-upper hinge may be formed in a cylindrical shape which guides an access of an electric wire to an inside of the sub-door.

The hinge shaft of the sub-upper hinge may be formed to have a circular cross section of which one side is opened.

A connector may be provided at an end of the electric wire guided to an outside of the sub-door through the hinge shaft of the sub-upper hinge, and may be coupled to an electric wire guided toward the cabinet.

The sub-upper hinge installation part may include a sub-hinge cover which accommodates the sub-upper hinge and further accommodates the electric wire coupled to the connector.

A main hinge cover which accommodates the upper hinge may be provided, and a sub-hinge cover which accommodates the sub-upper hinge may be provided, and the main hinge cover and the sub-hinge cover may have a connection part which rotatably connects each other, and the electric wire may be guided from the inside of the sub-door to the cabinet through the connection part.

The connection part may include a main connection part which is located at an upper side of a rotating center of the upper hinge and of which at least a part of an upper surface is opened; and a sub-connection part which is seated on the main connection part and is in communication with the main connection part, and centers of the upper hinge, the main connection part and the sub-connection part may be concentrically located.

The sub-hinge cover may be formed in a shape corresponding to a space between the sub-upper hinge installation part and the main hinge cover.

A plurality of door baskets may be installed at the opening part.

A front end of each of the door baskets which face the sub-door may be spaced part from a rear surface of the sub-door.

A front surface of each of the door baskets may be formed to be inclined from one side thereof toward the other side thereof and thus to be gradually distant from the rear surface of the sub-door.

The door lighting unit may be disposed at an upper portion of the opening part, and may also be disposed between the front surface of the door basket and the rear surface of the sub-door.

The refrigerator may further include a dividing member which is rotatably provided at each of both side surfaces of the door basket, extends so as to cross an inside of the door basket, and is rotated at a preset angle to divide the inside of the door basket.

The refrigerator may further include a stopper which is installed at each of both side surfaces of the door basket so that the dividing member is inserted therein, and in which a fixing groove in which the dividing member is inserted is formed at each set angle of a circumference thereof so as to fix the dividing member at the set angle.

The dividing member may include a dividing part which crosses the inside of the door basket, a first bent part which is bent from each of both ends of the dividing part, a second bent part which is bent again from the first bent part and inserted into the fixing groove, and an insertion part which is bent from an end of the second bent part and rotatably inserted into a center of the stopper.

The first bent part and the second bent part may form to have different lengths from each other.

A sensor opening in which the knock detection device is inserted may be formed at a rear surface of the door liner.

The refrigerator may further include an accommodation case which is installed at the door liner to be in communication with the sensor opening, extends to the rear surface of the panel assembly, and forms a space for accommodating the knock detection device.

The knock detection device and a detection device PCB which determines a signal of the knock detection device may be installed at an inside of the accommodation case.

An insert cover may be installed at the sensor opening, and the detection device PCB which determines a signal of the knock detection device may be installed at the insert cover.

An insert cover which shields the sensor opening may be installed at the sensor opening, and the insert cover may include a cover part which is formed in a shape corresponding to the sensor opening, and an insertion part which extends from the cover part, is inserted into the sub-door, and at which the detection device PCB for determining a signal of the knock detection device is installed.

An insert cover which shields the sensor opening may be installed at the sensor opening, and a cover groove which forms a part of a liner groove in which a sub-gasket is installed may be formed at the insert cover.

The knock detection device may include a microphone module which is in contact with the rear surface of the panel assembly and receives a sound generated by vibration due to a knock transmitted through the panel assembly; an elastic member which presses the microphone module toward the panel assembly; and a support member in which the elastic member is accommodated and which is installed and fixed to the inside of the sub-door.

The microphone module may include a microphone accommodation part which is formed of an elastic material to accommodate a microphone, and an opening which faces the panel assembly and a protrusion which protrudes along a circumference of the opening and is in close contact with the panel assembly may be formed at the microphone accommodation part.

The panel assembly may include a front panel which forms a front surface of the sub-door, and is formed in a half mirror which is selectively transparent by reflecting a part of light and transmitting another part of the light; a plurality of insulation panels which are spaced apart from the front panel, and formed of transparent tempered glass; and a spacer bar which is provided between the front panel and the insulation panel and between the insulation panels, and spaces and seals between the front panel and the insulation panel and between the insulation panels.

The front panel may extend outward further than the insulation panel, and a bezel which blocks the light may be formed along an extending edge of the front panel, and the knock detection device may be disposed at a rear surface of the bezel.

The details of one or more implementations are set forth in the accompanying drawings and the description below.

Other features will be apparent from the description and drawings, and from the claims.

DETAILED DESCRIPTION

Figure 1:
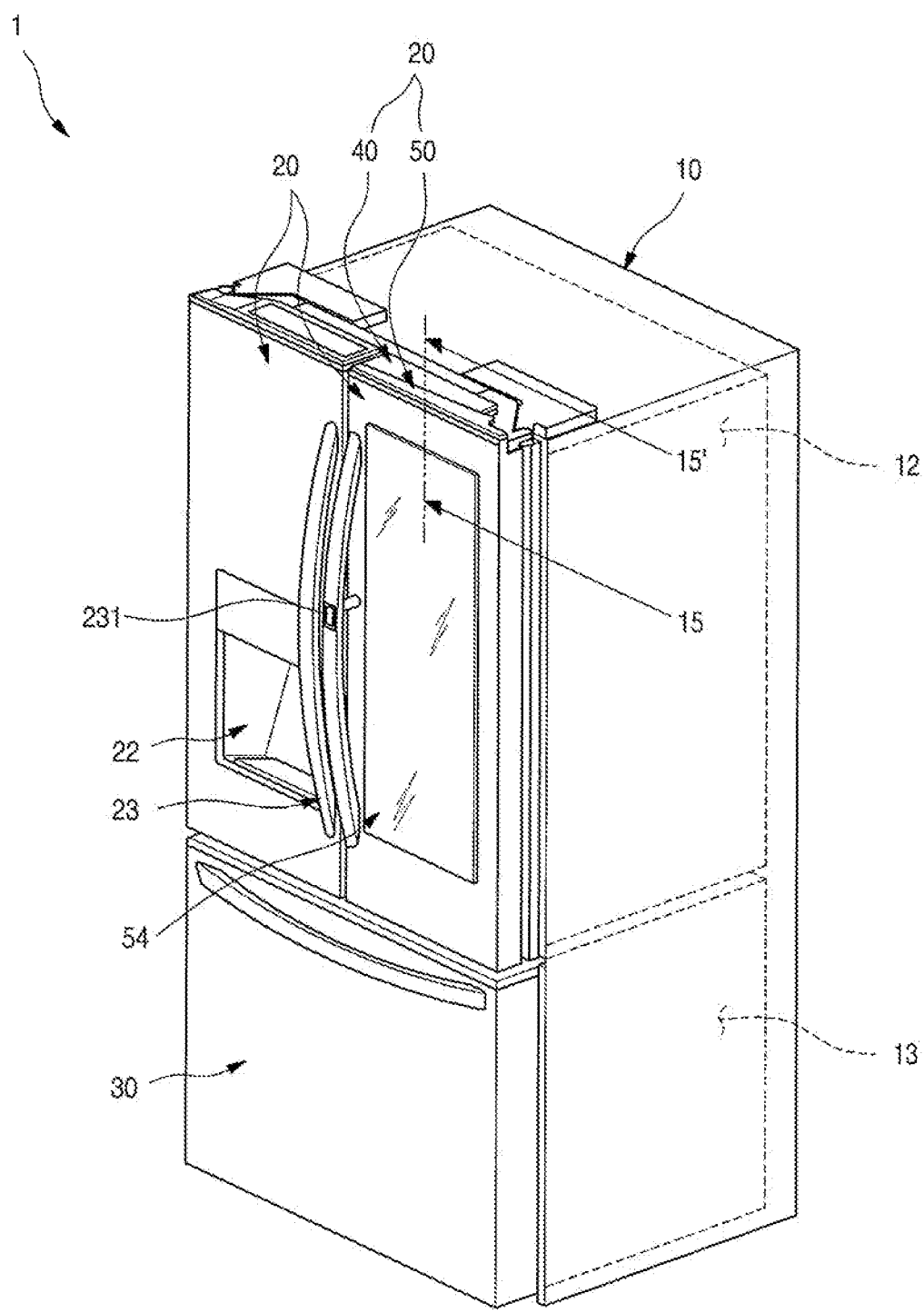
FIG. 1 is a perspective view of an example refrigerator.
Figure 2:
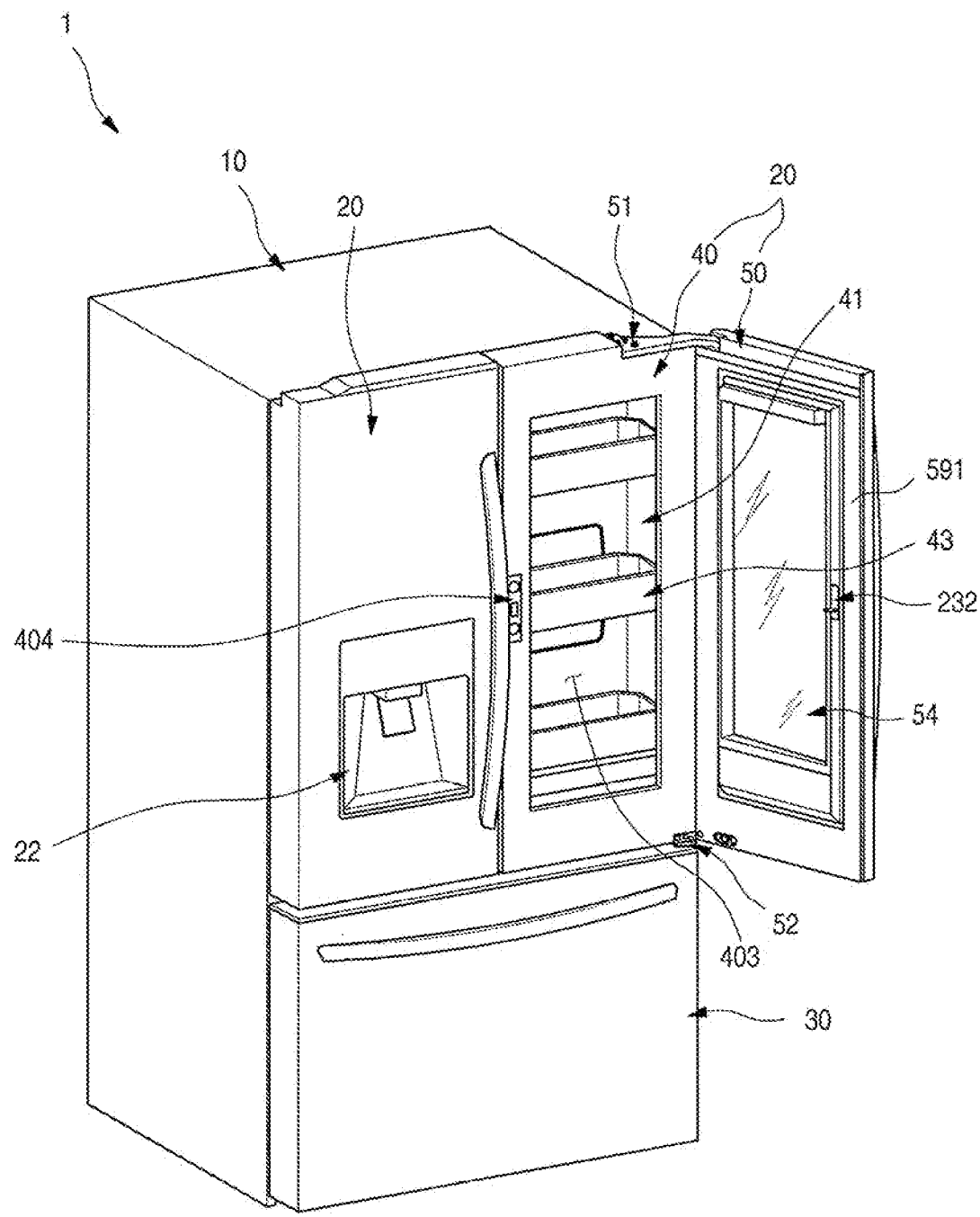
FIG. 2 is a perspective view illustrating a state in which a sub-door of the refrigerator is opened.
Figure 3:
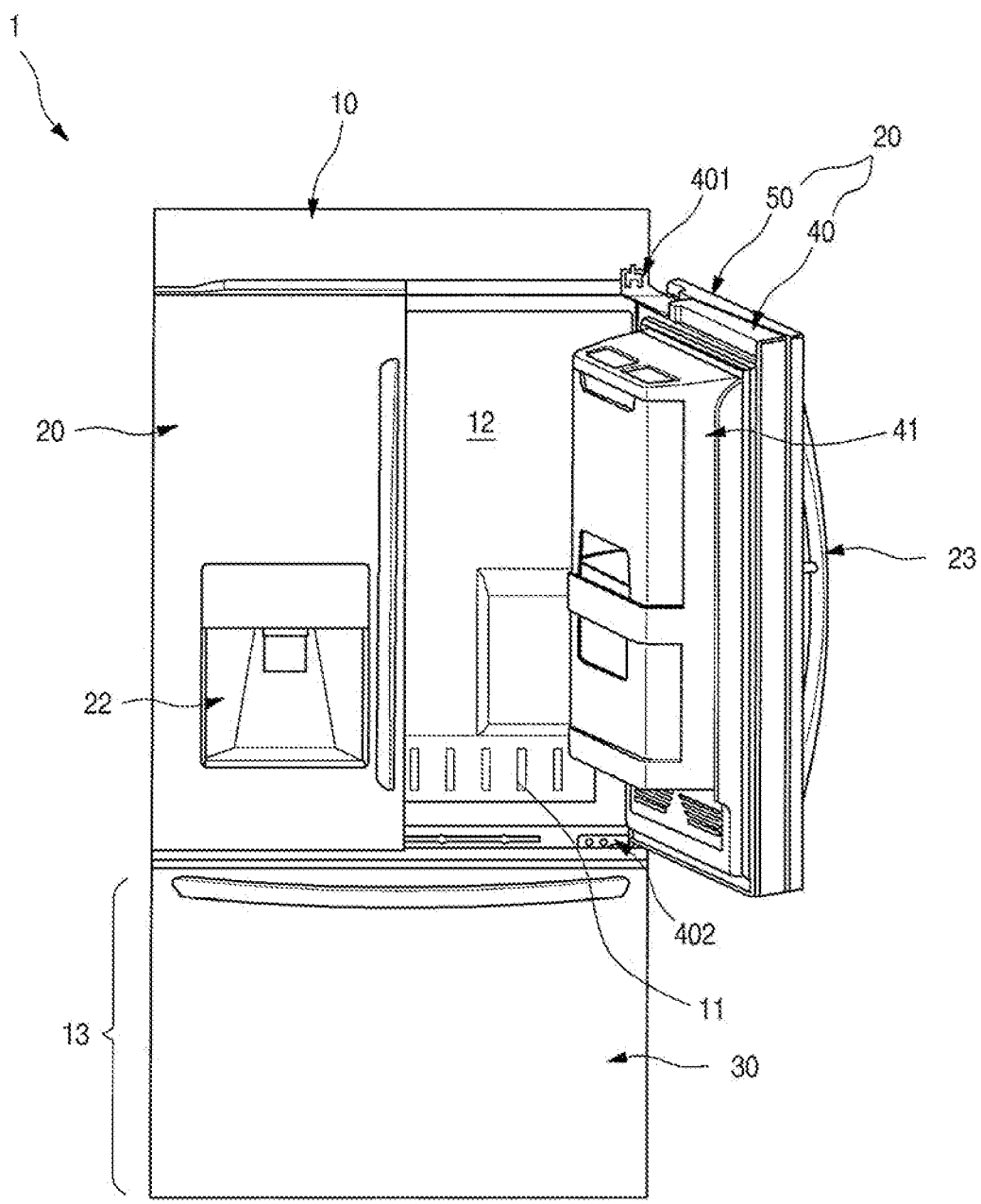
FIG. 3 is a perspective view illustrating a state in which a main door of the refrigerator is opened.

As illustrated in FIG. 1, an external appearance of a refrigerator 1 may be formed by a cabinet 10 which forms a storage space and a door which opens and closes the storage space.

An inside of the cabinet 10 may be divided by a barrier 11, and a refrigerator compartment 12 may be formed at an upper portion of the cabinet 10, and a freezer compartment 13 may be formed at a lower portion of the cabinet 10.

The door may include a refrigerator compartment door 20 and a freezer compartment door 30. The refrigerator compartment door 20 may be formed to open and close an opened front surface of the refrigerator compartment 12, and the freezer compartment door 30 may be formed to open and close an opened front surface of the freezer compartment 13.

One pair of refrigerator compartment doors 20 may be provided left and right, and the refrigerator compartment 12 may be formed to be shielded by the pair of refrigerator compartment doors 20. The freezer compartment door 30 may be withdrawn in a drawer manner, and thus may be opened and closed by inserting and withdrawing motions.

Various accommodation members such as a shelf, a drawer and a basket may be provided inside the refrigerator compartment 12 and the freezer compartment 13. The accommodation members may be inserted or withdrawn while the refrigerator compartment door 20 and the freezer compartment door 30 are opened, and food may be accommodated and stored in the refrigerator and freezer compartments by the inserting and withdrawing motions of the accommodation members.

The exterior of the refrigerator 1 may be formed of a metal material t. A dispenser 22 which dispenses water or ice may be provided at the refrigerator compartment door 20.

A right one of the pair of refrigerator compartment doors 20 may be formed to be doubly opened and closed. Specifically, the right refrigerator compartment door 20 may include a main door 40 which opens and closes the refrigerator compartment 12, and a sub-door 50 which is rotatably disposed at the main door 40 to open and close an opening part 403 formed at the main door 40.

The main door 40 may be formed to have the same size as that of a left one of the pair of refrigerator compartment doors 20, may be rotatably installed at the cabinet 10 by an upper hinge 401 and a lower hinge 402, and may open and close at least a part of the refrigerator compartment 12.

The opening part 403 which is opened in a predetermined size is formed at the main door 40. A door basket 43 is installed at a rear surface of the main door 40 including an inside of the opening part 403. A user may have access to the door basket 43 through the opening part 403 without opening of the main door 40. At this point, a size of the opening part 403 may correspond to most of a front surface of the main door 40 except a part of an edge of the main door 40.

The sub-door 50 is rotatably installed at the front surface of the main door 40, and opens and closes the opening part 403. Therefore, access to the opening part 403 may be allowed by opening the sub-door 50.

A size of the sub-door 50 is formed to be same as that of the main door 40 and thus to shield an entire front surface of the main door 40. The main door 40 and the sub-door 50 may be formed to be coupled to each other while the sub-door 50 is closed, and to have the same size and shape as those of the left refrigerator compartment door 20. A sub-gasket 591 may be provided at a rear surface of the sub-door 50 to seal between the main door 40 and the sub-door 50.

A panel assembly 54 formed of a transparent material such as glass is provided at a center of the sub-door 50. Therefore, even while the sub-door 50 is closed, the user may see through an inside of the opening part 403. The sub-door 50 may be referred to as a see-through door.

The panel assembly 54 may be formed to have a controllable light transmittance and reflectivity, and thus may be selectively changed into a transparent or opaque state according to a user's operation. The panel assembly 54 may be changed into the transparent state only upon a user's request to allow the user to see through the refrigerator, otherwise may be maintained in the opaque state.

A sub-upper hinge 51 and a sub-lower hinge 52 may be provided at an upper end and a lower end of the sub-door 50, respectively, and the sub-door 50 may be rotatably installed at the front surface of the main door 40. The sub-door 50 may be formed to be independently rotated while the main door 40 is closed, and thus to open and close the opening part 403.

A handle 23 may be provided at a front surface of the refrigerator compartment door 20. The handle 23 may be formed at each of adjacent ends of the pair of refrigerator compartment doors 20. The handle 23 of the right refrigerator compartment door 20 may be provided at a front surface of the sub-door 50.

An operating button 231 is provided at the handle 23, and a locking unit 232 which is operated by the operating button 231 is provided at the sub-door 50. The locking unit 232 protrudes to a rear of the sub-door 50, and may be selectively separated from a restricting member 404 of the main door 40 by an operation of the operating button 231.

Therefore, while the sub-door 50 is closed, the locking unit 232 is maintained in a coupled state to the restricting member 404. In this state, when the handle 23 is pulled, the main door 40 is rotated, and thus the refrigerator compartment 12 may be opened.

When the user pushes the operating button 231 while the sub-door 50 is closed, the locking unit 232 is separated from the restricting member 404, and only the sub-door 50 may be rotated. The opening part 403 may be opened by rotation of the sub-door 50.

An accommodation case 41 is formed at the rear surface of the main door 40. The accommodation case 41 serves to define an accommodation space located at the rear surface of the main door 40, and a plurality of door baskets 43 are disposed therein.

Figure 4:
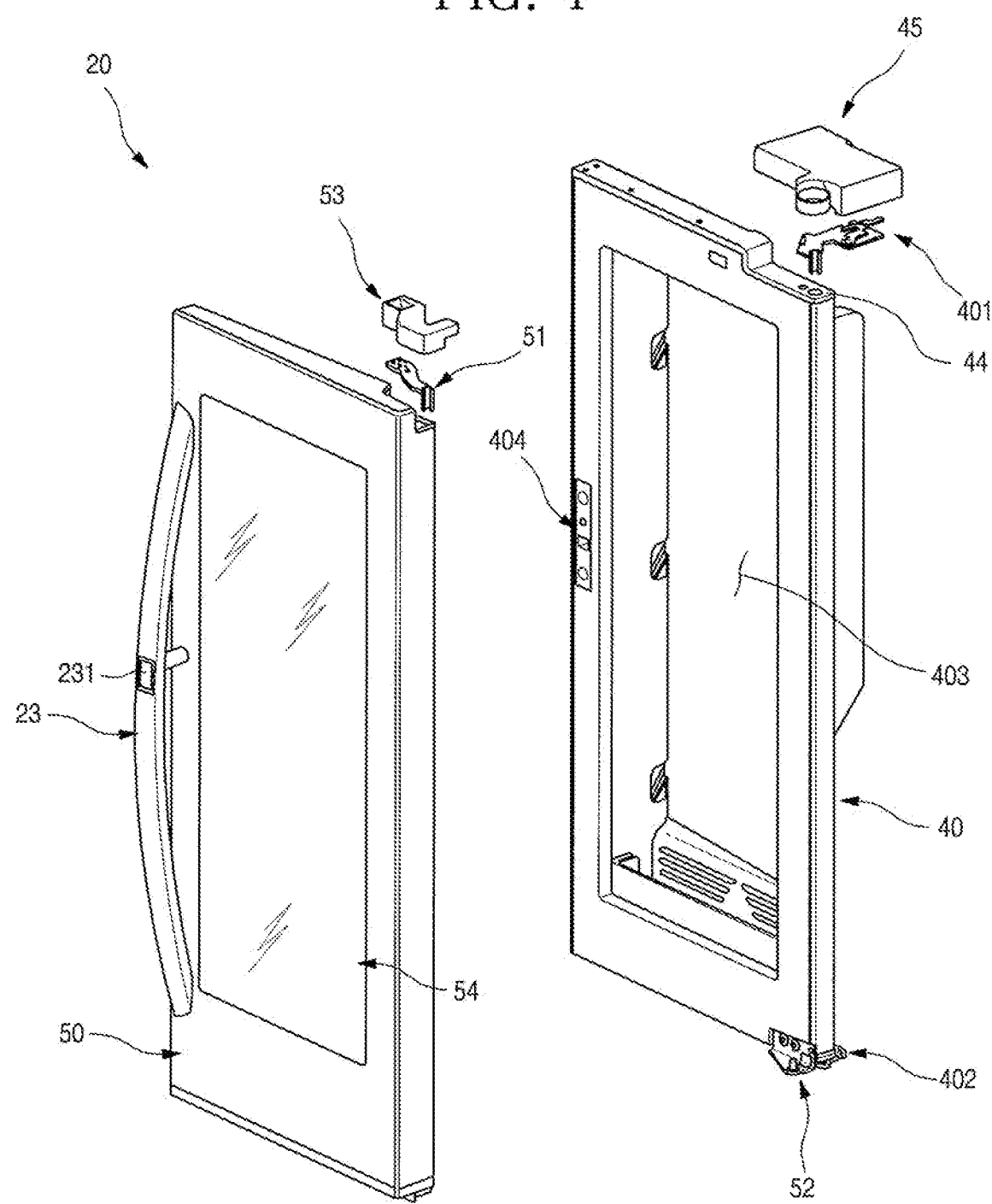
FIG. 4 is an exploded perspective view illustrating a coupling structure between the main door and the sub-door.
Figure 5:
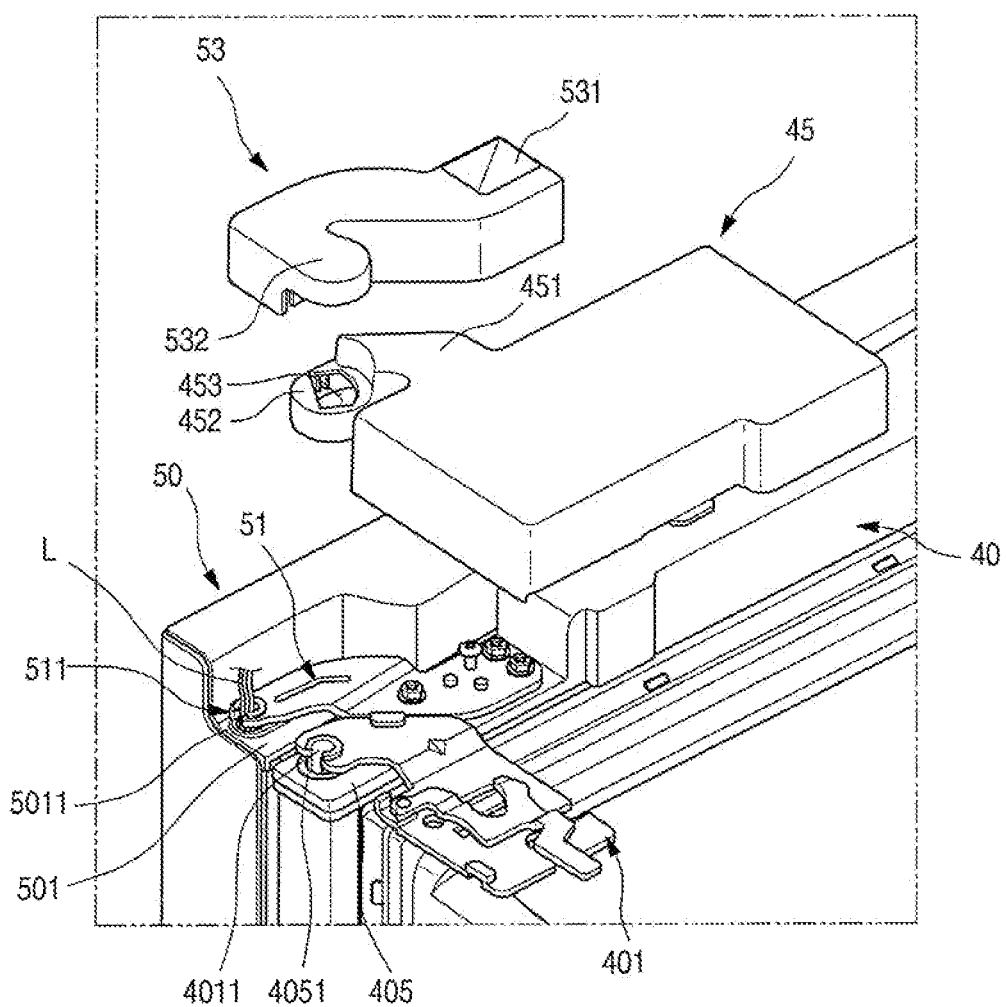
FIG. 5 is a partial perspective view illustrating a hinge coupling structure between the main door and an upper end of the sub-door.
Figure 6:
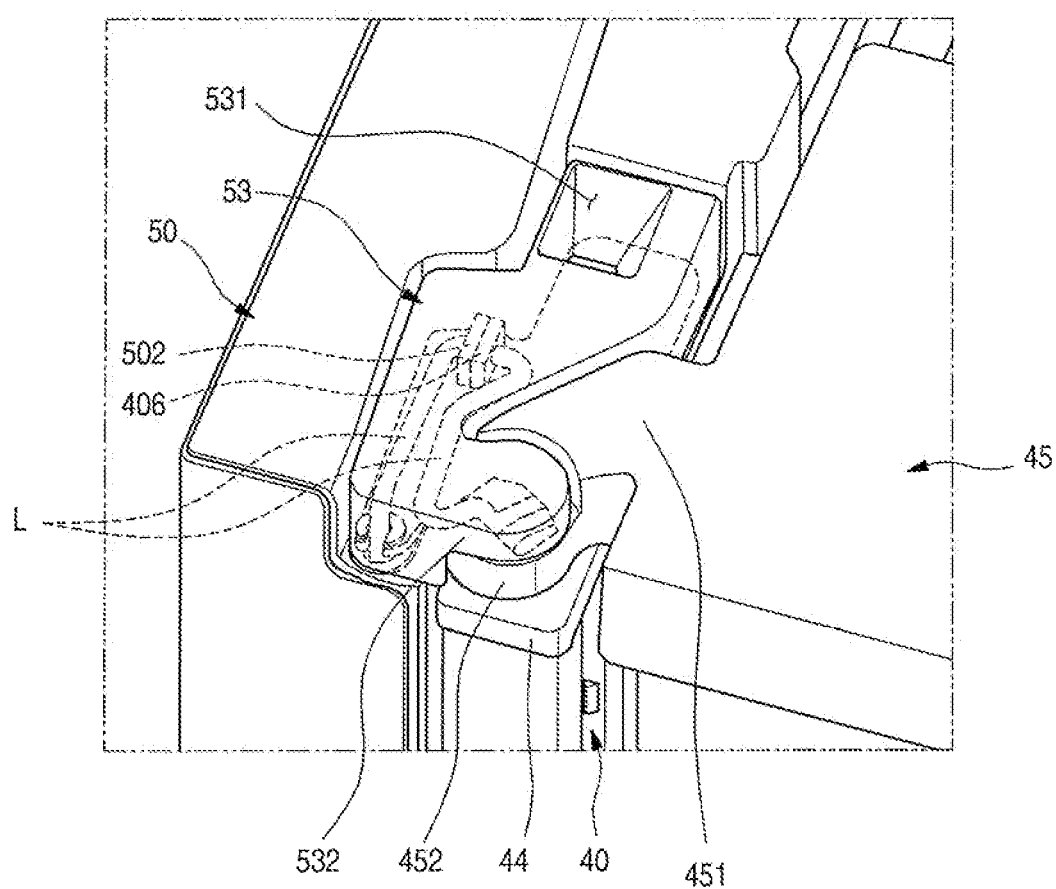
FIG. 6 is a partial perspective view illustrating a state in which a hinge cover is installed at the main door and the sub-door.

As illustrated in FIGS. 4-6, an upper hinge installation part 405 at which the upper hinge 401 is installed is formed at an upper end of the main door 40 to be recessed. The upper hinge 401 is installed and fixed to the cabinet 10, and a hinge shaft 4011 is inserted into a hinge hole 4051 of the upper hinge installation part 405, and thus the main door 40 is rotatably installed at the cabinet 10.

A sub-upper hinge installation part 501 at which the sub-upper hinge 51 is installed is formed at an upper end of the sub-door 50 to be recessed. The sub-upper hinge 51 is installed and fixed to the upper hinge installation part 405, and a hinge shaft 511 is inserted into a hinge hole 5011 of the sub-upper hinge installation part 501, and the sub-door 50 is rotatably installed at the main door 40.

The hinge shaft 511 of the sub-upper hinge 51 may be formed in a tube shape having a cross section of which one side is opened. Such a cross-sectional structure provides an internal space of the hinge shaft 511 which further expands. Therefore, electric wires L which are connected with electronic components (a heater, a knock detection device and a door lighting unit which will be described below) provided at the sub-door 50 may be guided outside the sub-door 50 through the hinge shaft 511 of the sub-upper hinge 51, and may be connected to a main control part 2 located on the cabinet 10.

The upper hinge 401 and the sub-upper hinge 51 are shielded by a main hinge cover 45 and a sub-hinge cover 53. The main hinge cover 45 and the sub-hinge cover 53 are connected to each other, and the electric wires L which are guided to an outside through the sub-upper hinge 51 may pass through the sub-hinge cover 53, and may be guided toward the main control part 2 through an inside of the main hinge cover 45.

Specifically, the main hinge cover 45 is formed so that a lower portion of the hinge is opened, and a recessed space is formed in the hinge to accommodate the entire upper hinge 401. A separate PCB for controlling the electronic components provided at a side of the sub-door 50 may be accommodated inside the main hinge cover 45.

The main hinge cover 45 may have a structure which is matched with one side of the cabinet 10, or a coupling structure which is installed and fixed by a separate coupling member. A part of the main hinge cover 45 is formed to extend toward the upper hinge installation part 405 of the main door 40.

An extension part 451 which extends toward a rotating axis of the upper hinge 401 may be further formed at one side of the main hinge cover 45. A main connection part 452 may be formed at an end of the extension part 451. The main connection part 452 may be formed to be stepped downward from the end of the extension part 451. The main connection part 452 may be formed in a circular shape, and a center of the main connection part 452 may be located on an extension line of the hinge shaft 4011 of the upper hinge 401. A connection part hole 453 is opened at an upper surface of the main connection part 452 so that the electric wires L pass through the connection part hole.

The sub-hinge cover 53 is formed so that a lower portion thereof is opened, and a recessed space is formed therein to accommodate the entire sub-upper hinge 51. The sub-hinge cover 53 may be installed and fixed to the upper hinge installation part 405. And a part of the sub-hinge cover 53 may extend toward the sub-upper hinge installation part 501, and may shield the sub-upper hinge 51.

A cover fixing part 531 which is recessed downward is formed at one side of the sub-upper hinge 51, and a coupling member like a screw may pass through the cover fixing part 531, may be fastened to the sub-upper hinge installation part 501, and thus may fix the sub-hinge cover 53.

A shape of the sub-hinge cover 53 is formed corresponding to a space between the sub-upper hinge installation part 501 and the main hinge cover 45 while the sub-door 50 is closed, and does not interfere with the sub-door 50 and the main door 40 when the sub-door 50 and the main door 40 are opened and closed.

A sub-connection part 532 is formed at one side of the sub-hinge cover 53. The sub-connection part 532 is formed to extend toward the main door 40, and seated on the upper surface of the main connection part 452. At this time, a lower surface of the sub-connection part 532 is opened, and thus an inside of the sub-connection part 532 may be in communication with an inside of the main connection part 452. Like the main connection part 452, the sub-connection part 532 is formed to have a circular cross section, and located on an extension line of a center of the rotating axis of the upper hinge 401.

That is, the center of the rotating axis of the upper hinge 401 and centers of the main connection part 452 and the sub-connection part 532 are concentrically disposed. Therefore, while the main door 40 and the sub-door 50 are rotated, the rotating axis of the upper hinge 401, the main connection part 452 and the sub-connection part 532 may be stably rotated without being shaken. When the main door 40 or the sub-door 50 is rotated, the electric wires L guided through the sub-hinge cover 53 may pass, in turn, through the sub-connection part 532 and the main connection part 452, and may be guided inside the main hinge cover 45.

The electric wires L may be connected by connectors 502 and 406, and the connectors 502 and 406 may be located inside the sub-hinge cover 53. Therefore, after the sub-connector 502 which is connected to ends of the electric wires L exposed outward through a rotating axis of the sub-upper hinge 51 and the main connector 406 of the electric wires L which are connected to the main control part 2 and guided toward the sub-upper hinge installation part 501 through the main hinge cover 45 are connected to each other, the sub-hinge cover 53 may be covered thereon, and thus the electric wires L, the connectors 502 and 406 and the sub-upper hinge 51 may be shielded.

The lower hinge 402 which supports a lower end of the main door 40 is installed at one side of a front surface of the cabinet 10. The sub-lower hinge 52 which supports the sub-door 50 is installed at the lower end of the main door 40.

Figure 7:
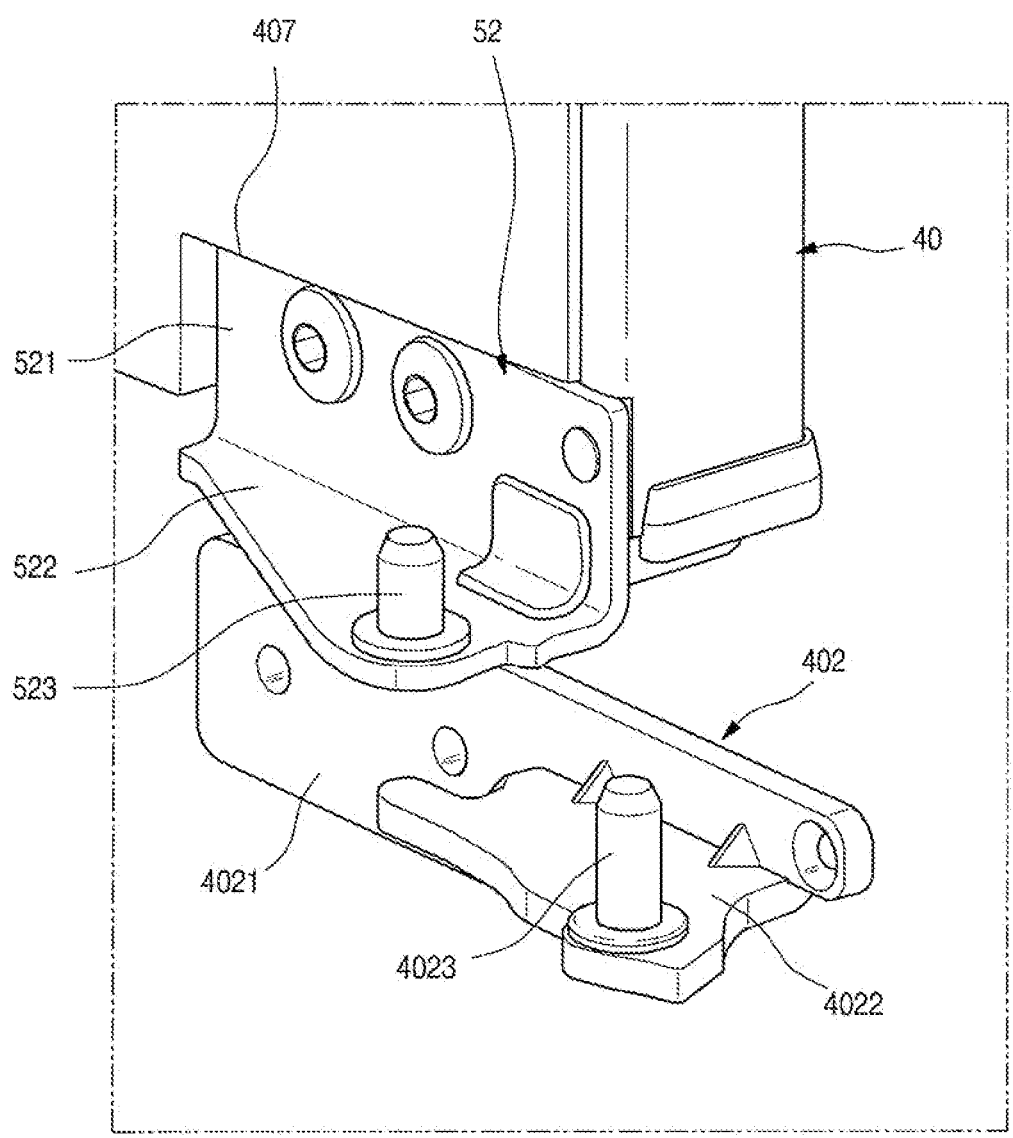
FIG. 7 is a partial perspective view illustrating the hinge coupling structure of a lower end of the main door.

As illustrated in FIG. 7, the lower hinge 402 is installed at the front surface of the cabinet 10, and serves to enable the main door 40 to be rotatably supported.

The lower hinge 402 may include a main fixing part 4021 which is fixed to the front surface of the cabinet 10, a main support part 4022 which is vertically bent from the main fixing part 4021 and supports the lower end of the main door 40, and a hinge shaft 4023 which extends upward from the main support part 4022 and is inserted into the main door 40. The lower end of the main door 40 is supported by the lower hinge 402, and the main door 40 may be rotated about the hinge shaft 4023.

The sub-lower hinge 52 is located at a front of the lower hinge 402, and provided at the lower end of the main door 40. The sub-lower hinge 52 may be installed at a sub-lower hinge installation part 407 which is recessed from the lower end of the front surface of the main door 40.

The sub-lower hinge 52 may include a sub-fixing part 521 which is fixed to the sub-lower hinge installation part 407, and a sub-support part 522 which is bent from a lower end of the sub-fixing part 521 and extends forward, and a hinge shaft 523 which extends upward from the sub-support part 522 and is inserted into the sub-door 50. Therefore, the lower end of the sub-door 50 is supported by the sub-lower hinge 52, and the sub-door 50 may be rotated about the hinge shaft 523.

Figure 8:
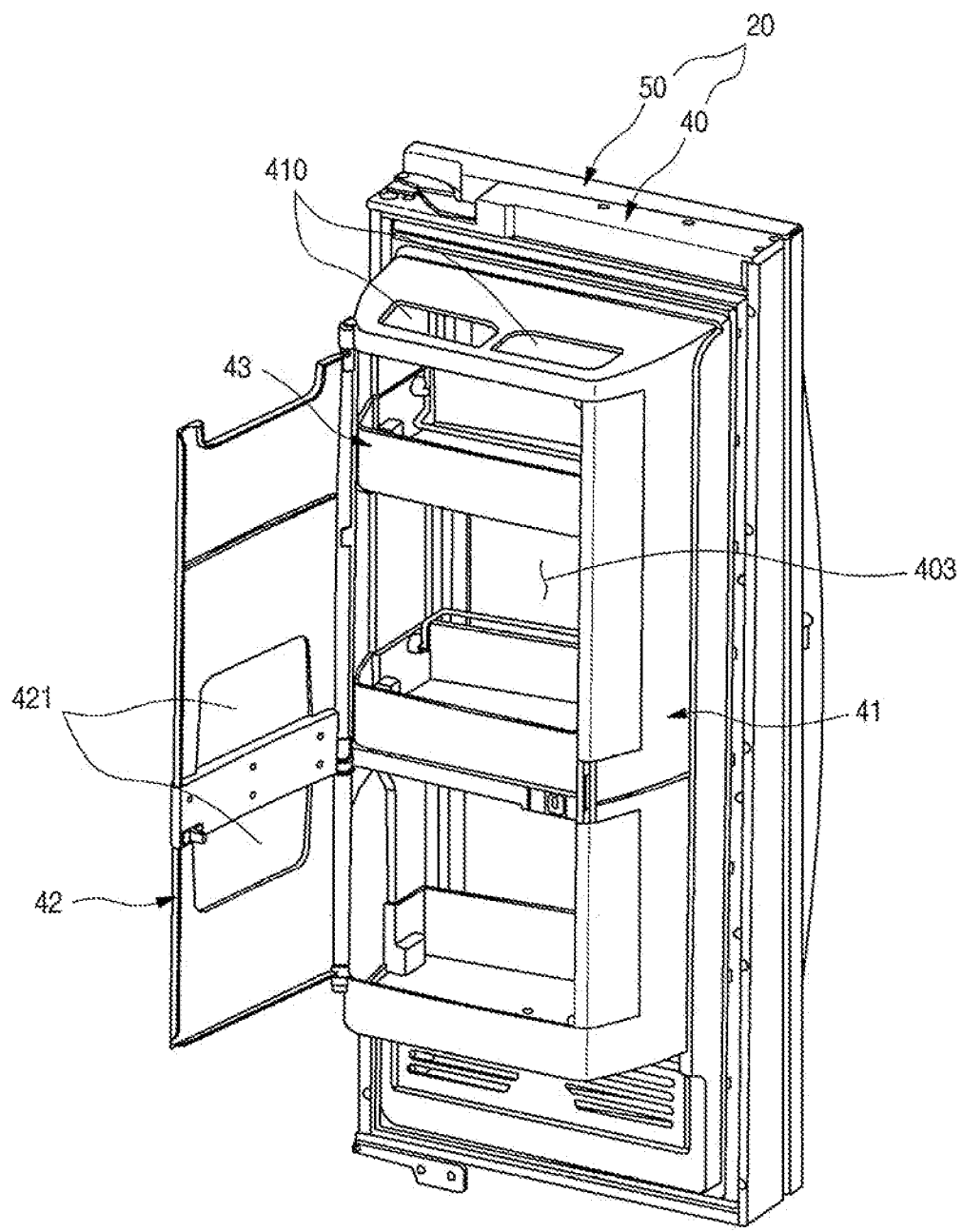
FIG. 8 is a perspective view of a refrigerator door of the refrigerator when being seen from a rear.

FIG. 8 is a perspective view of the refrigerator door of the refrigerator when being seen from a rear.

As illustrated in FIG. 8, a front surface of the accommodation case 41 is opened, and the opened front surface of the accommodation case 41 may be formed corresponding to the size of the opening part 403. Therefore, when the sub-door 50 is opened, the opening part 403 is exposed, and the access to the door basket 43 inside the accommodation case 41 through the opening part 403 may be allowed.

A case door 42 which is opened and closed by rotation may be provided at a rear surface of the accommodation case 41. While the main door 40 is opened, the access to the door basket 43 may be allowed by opening the case door 42.

A case opening 410 and a door opening 421 which allows the cooling air in the refrigerator to be introduced into the accommodation case 41 may be formed at the accommodation case 41 and the case door 42. A temperature inside the accommodation case 41 may be maintained to be the same as an internal temperature of the refrigerator compartment 12.

A molded end at which the door basket 43 is installed may be formed at the rear surface of the main door 40, more specifically, both side surfaces of the opening part 403. The molded end may be formed in an uneven structure, and may also be formed to enable the door basket 43 to be separated.

Figure 9:
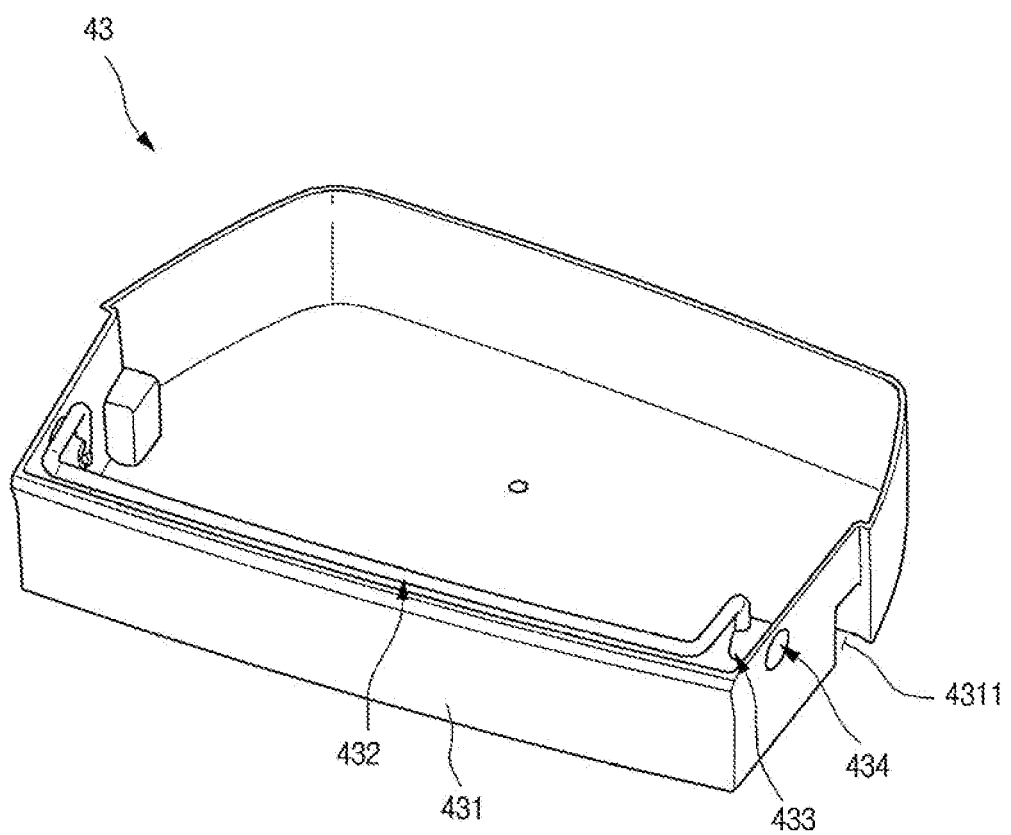
FIG. 9 is a perspective view of an example of a door basket
Figure 10:
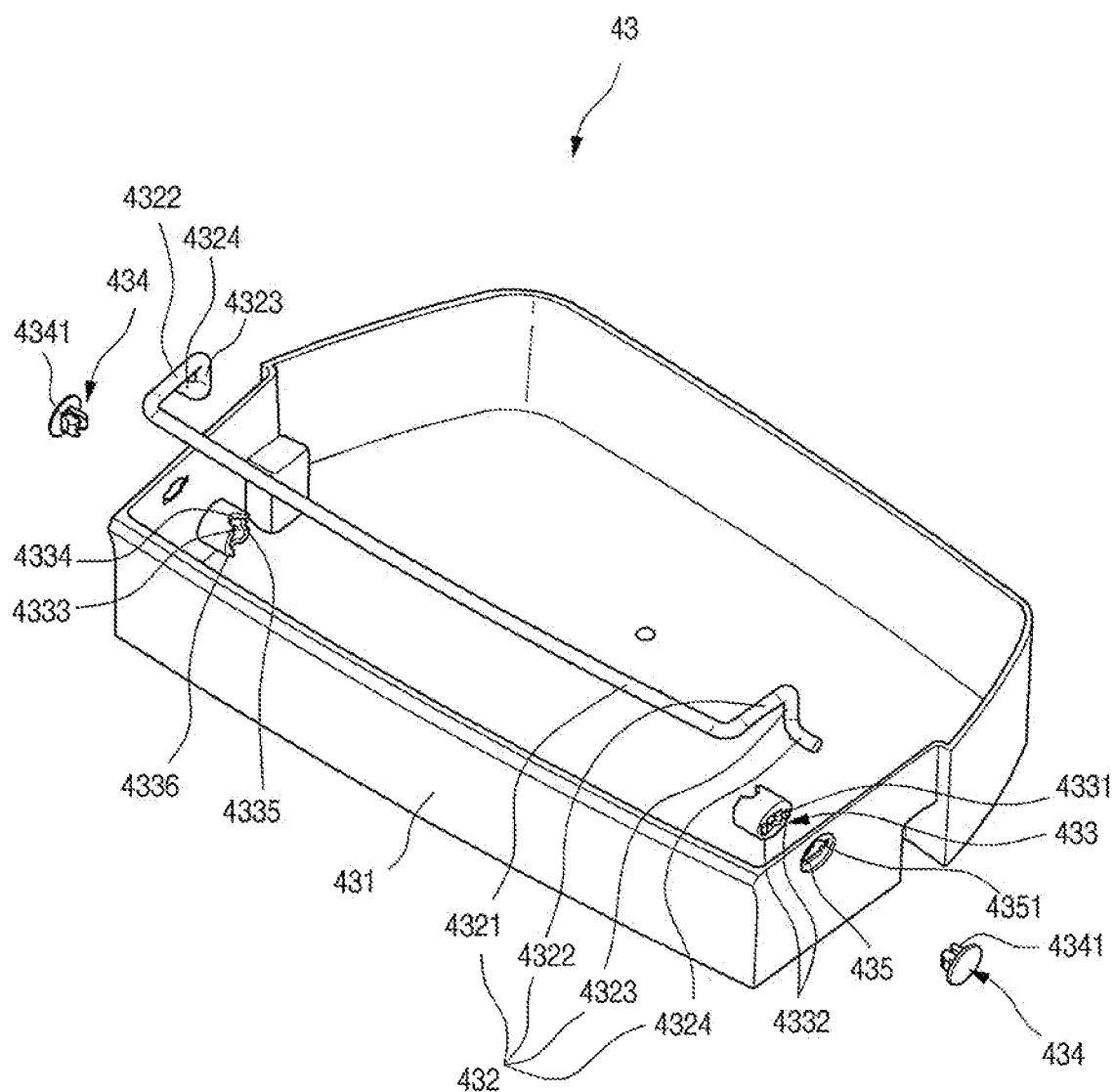
FIG. 10 is an exploded perspective view of the door basket.

As illustrated in FIGS. 9 and 10, the door basket 43 is formed so that an upper surface of the door basket is opened, and has an installation part 431 which is disposed inside the opening part 403. The installation part 431 has a width corresponding to that of the opening part 403, and an installation groove 4311 which is coupled to the molded end of the opening part 403 may be formed at both side surfaces thereof.

A rear surface of the installation part 431 which faces the rear surface of the sub-door 50 may be formed to be inclined. Therefore, a predetermined distance may be formed between the rear surface of the sub-door 50 and a rear surface of the installation part 431, and light emitted from a door lighting unit 49 is not blocked, and the light illuminates the entire opening part 403.

The door basket 43 may include a dividing member 432, a stopper 433 which enables the dividing member 432 to be fixed at a set angle, and a stopper cap 434 for installation of the stopper 433.

The dividing member 432 may be formed of a wire or rod material, and may have a circular cross section having a predetermined diameter. The dividing member 432 may include a dividing part 4321 which extends to cross the installation part 431, a first bent part 4322 which is bent vertically from each of both ends of the dividing part 4321, a second bent part 4323 which is bent vertically from the first bent part 4322, and an insertion part 4324 which is bent outward from each of both ends of the second bent part 4323 and inserted into the stopper 433.

The stopper 433 is installed at an inner side surface of the installation part 431, and disposed at each of left and right side surfaces to fix the dividing member 432. The stopper 433 may be formed in a cylindrical shape, and a cap insertion hole 4331 in which the stopper cap 434 is installed may be formed at one side surface thereof which is contact with the installation part 431. A stopper hook 4332 which fixes the stopper 433 to the installation part 431 may be formed at an outside of the cap insertion hole 4331.

A center hole 4333 in which the insertion part 4324 of the dividing member 432 is inserted may be formed at a center of opposite surfaces of the stopper 433 which are disposed at both sides of the stopper 433. A fixing groove which is recessed inward centering on the center hole 4333 may be formed at a circumference of the stopper 433. The fixing groove is formed in a shape corresponding to that of an outer surface of the dividing member 432, and accommodates and fixes the second bent part 4323 of the dividing member 432.

The fixing groove may include a first fixing groove 4334 which enables the dividing member 432 to be located at a first position, a second fixing groove 4335 which enables the dividing member 432 to be located at a second position, and a third fixing groove 4336 which enables the dividing member 432 to be located at a third position. The first fixing groove 4334 and the third fixing groove 4336 may be formed at positions which vertically face each other in upward and downward directions of the stopper 433, and the second fixing groove 4335 may be formed at a middle portion between the first fixing groove 4334 and the third fixing groove 4336. Each of the fixing grooves may be disposed at an angular interval of 90°, and may fix the dividing member 432 at each position which is rotated by an angle of 90°.

The first position corresponds to a state in which the second bent part 4323 is inserted into the first fixing groove 4334. In this state, the dividing part 4321 of the dividing member 432 is in close contact with an inner wall surface of the door basket 43, as illustrated in FIG. 9, and an entire internal space of the door basket 43 may be used as one accommodation space.

The second position corresponds to a state in which the second bent part 4323 is inserted into the second fixing groove 4335. In this state, the dividing part 4321 of the dividing member 432 is located at a position which is spaced apart from the inner wall surface of the door basket 43, and thus the internal space of the door basket 43 is divided into two spaces. At this time, the position of the dividing part 4321 is located at a position which is spaced apart from a position of the stopper 433 by a length of the second bent part 4323, and divides the space.

The third position corresponds to a state in which the second bent part 4323 is inserted into the third fixing groove 4336. In this state, like the second position, the dividing part 4321 of the dividing member 432 is located at a position which is spaced apart from the inner wall surface of the door basket 43, and the internal space of the door basket 43 is divided into two spaces.

At this time, the position of the dividing part 4321 is located at a position which is spaced apart from the position of the stopper 433 by a length of the first bent part 4322, and divides the space. Since the first bent part 4322 and the second bent part 4323 are formed to have different lengths from each other, the user may selectively use the space according to a divided degree of the space occurring by a length difference between the first bent part 4322 and the second bent part 4323.

Figure 11:
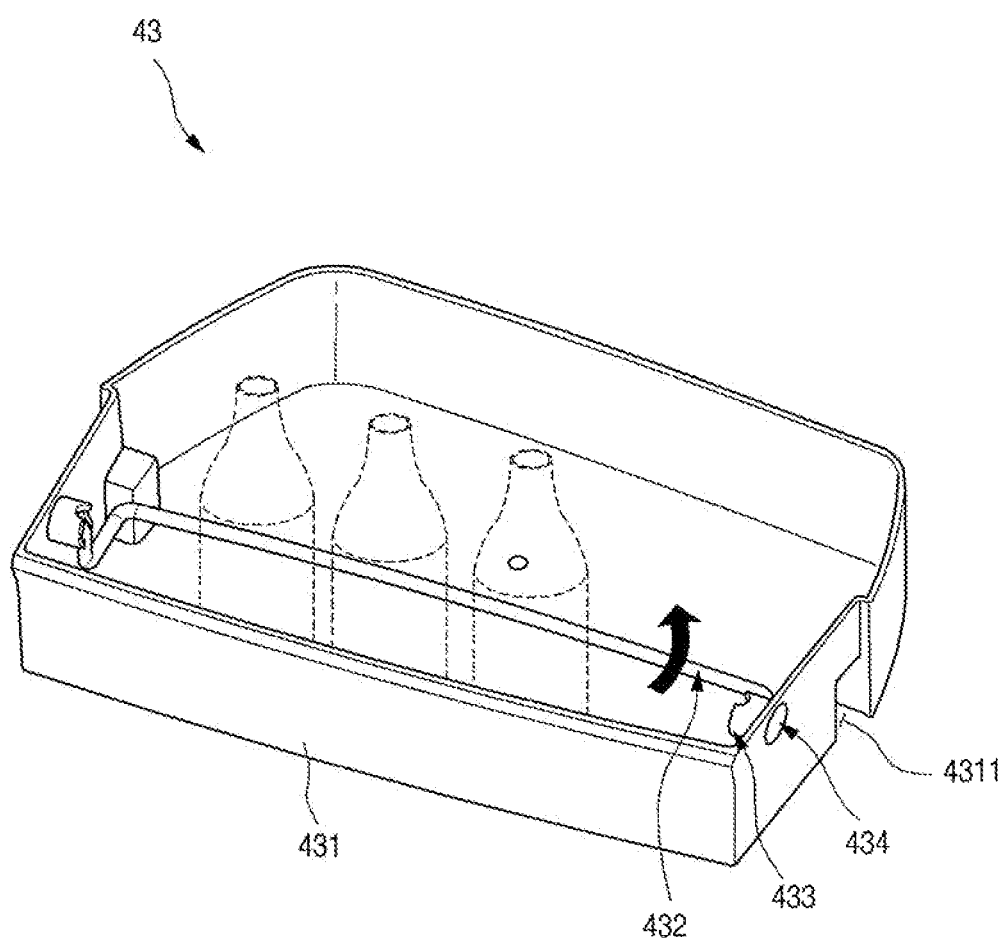
FIG. 11 is a perspective view illustrating a use state of a dividing member of the door basket.

In particular, as illustrated in FIG. 11, in the case in which the dividing member 432 is located at the second position and the third position, and thus divides the internal space of the door basket 43 into the two spaces, each of the spaces has a narrow width and a high height, and thus may effectively store sauce bottles or tube containers which easily fall down.

A stopper fixing hole 435 is formed at both side surfaces of the installation part 431. A fixing groove 4351 is further formed at the stopper fixing hole 435 so that the stopper hook 4332 is hooked and restricted thereto. Therefore, the stopper 433 may be fixed to the inner side surface of the installation part 431 so as not to be rotated. The stopper cap 434 may be provided outside the installation part 431. The stopper cap 434 is installed in the stopper fixing hole 435, and a cap hook 4341 provided at a center of the stopper cap 434 may pass through the stopper fixing hole 435, and may be hooked and restricted into the cap insertion hole 4331. Therefore, the stopper 433 may be further firmly fixed by the stopper cap 434.

Figure 12:
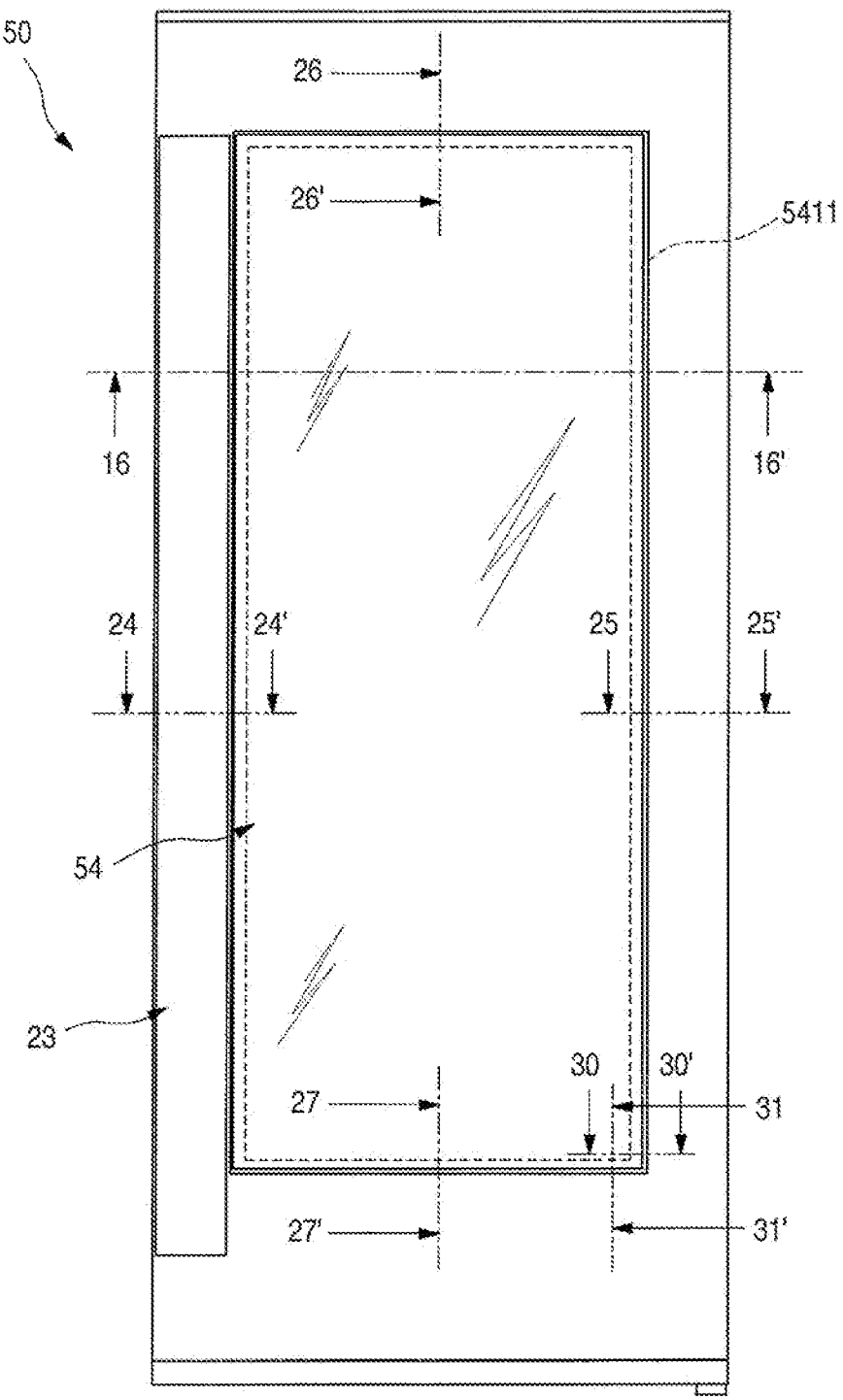
FIG. 12 is a front view of the sub-door.
Figure 13:
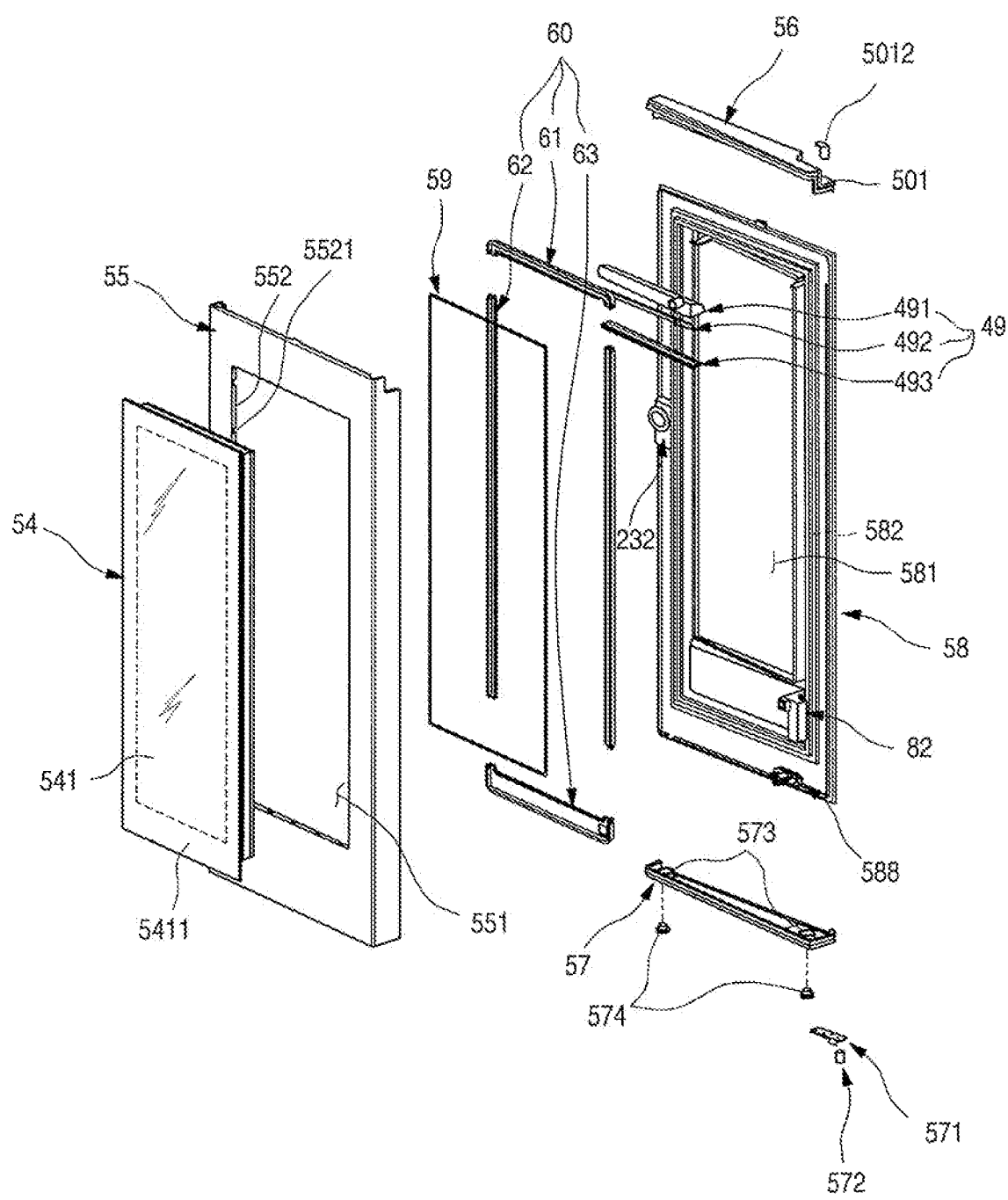
FIG. 13 is an exploded perspective view of the sub-door.

As illustrated in FIGS. 12 and 13, the sub-door 50 may include an outer plate 55 which forms an exterior of the sub-door 50, the panel assembly 54 which is installed at an opening of the outer plate 55, a door liner 58 which is installed to be spaced apart from the outer plate 55, and an upper cap decoration 56 and a lower cap decoration 57 which form an upper surface and a lower surface of the sub-door 50.

The outer plate 55 forms the exterior of the front surface and a part of a perimeter surface of the sub-door 50, and may be formed of a stainless material. A panel installation opening 551 in which the panel assembly 54 is formed is formed at a center of the outer plate 55. The panel installation opening 551 is a space which sees through the inside of the opening part 403 of the main door 40, and may be formed to be the same as or similar to the size of the opening part 403. A plate bent part 552 which is vertically bent inward along a perimeter of the panel installation opening 551 is formed. The plate bent part 552 is bent so as to be inserted into a support frame 60, and plate holes 5521 which are opened at regular intervals may be continuously formed at the plate bent part 552.

The panel assembly 54 is formed to shield the panel installation opening 551, and while the panel assembly 54 is installed, a front surface of the panel assembly 54 may form the same plane as a front surface of the outer plate 55. The panel assembly 54 may be selectively transparent according to On/Off of the door lighting unit 49, and may be formed to enable the user to selectively see through the inside of the opening part 403. The upper cap decoration 56 forms the upper surface of the sub-door 50, and is coupled to upper ends of the outer plate 55 and the door liner 58. The sub-upper hinge installation part 501 is formed at one end of the upper cap decoration 56, and an upper boss 5012 in which the hinge shaft 523 of the upper hinge 401 is inserted may be installed at the sub-upper hinge installation part 501.

The lower cap decoration 57 forms the lower surface of the sub-door 50, and is coupled to lower ends of the outer plate 55 and the door liner 58. A hinge plate 571 is installed at a position of the lower cap decoration 57 at which the sub-lower hinge 52 is installed, and a lower boss 572 in which the hinge shaft 523 of the sub-lower hinge 52 is inserted may be installed at the hinge plate 571.

Two foaming solution injecting holes 573 may be formed at the lower cap decoration 57. The foaming solution injecting holes 573 are formed to inject a foaming solution which forms an insulation at a perimeter of the panel assembly 54 in an internal space of the sub-door 50. At this point, to smoothly inject the foaming solution into the sub-door 50, a vertical lower side corresponding to a space between an outside of the panel assembly 54 and an inner side surface of the sub-door 50 is formed to be opened. When the foaming solution is injected, the foaming solution may be prevented from flowing back or being incompletely filled, and may be effectively injected. The foaming solution injecting holes 573 may be shielded by injecting hole caps 574 which are installed at the lower cap decoration 57.

The door liner 58 forms the rear surface of the sub-door 50, and a liner opening 581 is formed at an area at which the panel assembly 54 is disposed. A liner groove 582 which maintains a shape of the door liner 58 may be formed along the liner opening 581 at a perimeter of the door liner 58. The liner groove 582 is recessed from the rear surface of the sub-door 50, and the sub-gasket 591 which seals between the sub-door 50 and the main door 40 may be installed thereat.

The locking unit 232 may be installed at one side of the door liner 58, and a knock detection device 82 and a door opening assist device 588 which are described below in detail may be installed.

A heater 59 may be provided inside the sub-door 50. The heater 59 is disposed along a perimeter of a rear surface of the panel assembly 54. Specifically, the heater 59 may be disposed at a rear surface of a front panel 541 which forms the front surface of the panel assembly 54, and may be installed at an area of a bezel 5411, which is formed at a perimeter of the front panel 541, so as not to be exposed outside.

The support frame 60 which fixes the outer plate 55 and the panel assembly 54 along the perimeter of the panel installation opening 551 is provided at a rear surface of the outer plate 55. The support frame 60 may be formed by coupling an upper frame 61, a lower frame 63 and one pair of side frames 62, may also be formed along an edge of the panel installation opening 551 to accommodate the plate bent part 552, and may be in contact with the rear surface of the panel assembly 54. The support frame 60 may fix the heater 59 which is disposed at the rear surface of the panel assembly 54. The door lighting unit 49 may be installed at an upper end of the liner opening 581. The door lighting unit 49 may illuminate a portion at the plurality of door baskets 43 disposed at the main door 40 are arranged, may enable the inside of the refrigerator to be brighter than an outside thereof, and thus may enable the panel assembly 54 to look transparent.

The door lighting unit 49 may include a lamp case 491 which is installed at the door liner 58, a lamp PCB 492 which is accommodated in the lamp case 491 and at which a plurality of LEDs 4921 are disposed, and a lamp cover 493 which shields an opened lower surface of the lamp case 491 and is exposed through the opening.

Figure 14:
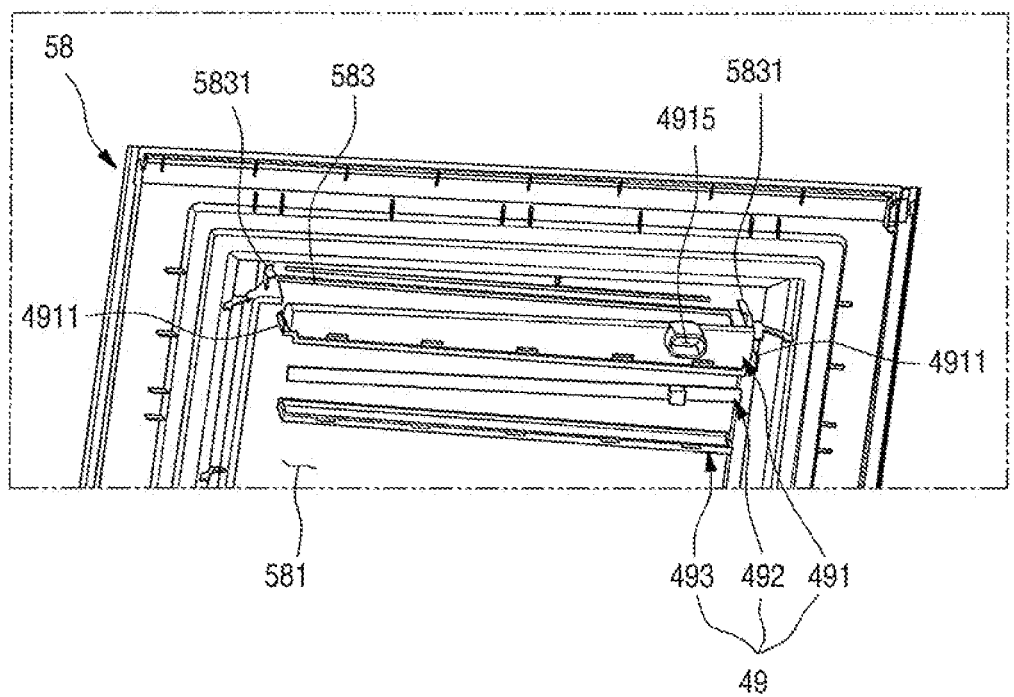
FIG. 14 is an exploded perspective view of an example of a door lighting unit.
Figure 15:
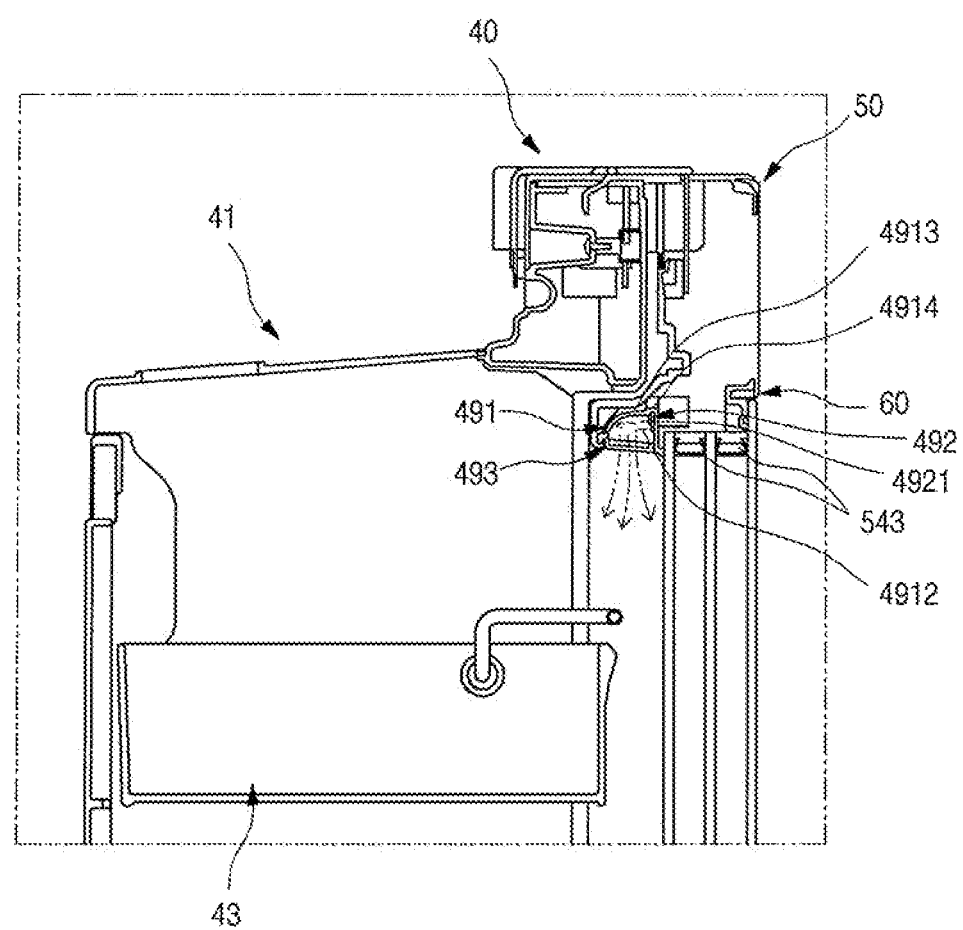
FIG. 15 is a cross-sectional view taken along line 15-15' of FIG. 1.
Figure 16:
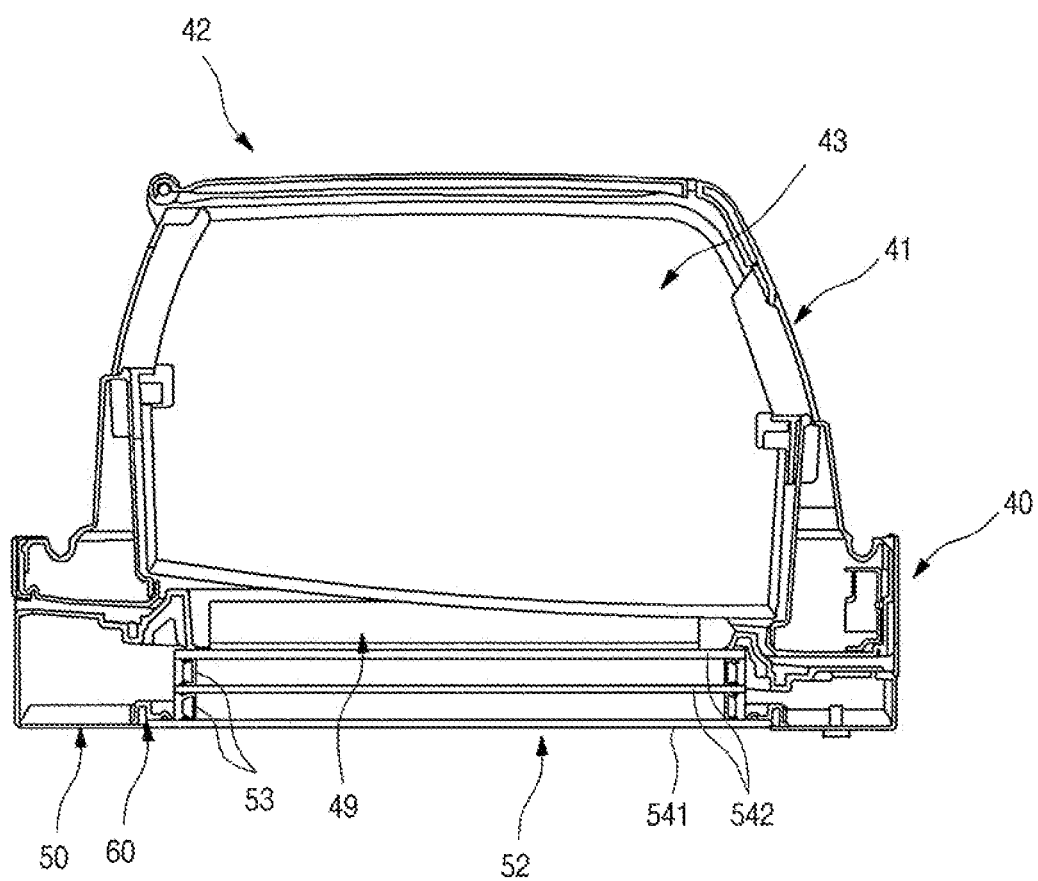
FIG. 16 is a cross-sectional view taken along line 16-16' of FIG. 12.

As illustrated in FIGS. 14, 15 and 16 the door lighting unit 49 may be installed at a lighting unit installation part 583 which is formed at an upper end of the liner opening 581 of the door liner 58.

A case fixing part 5831 is formed at both ends of the lighting unit installation part 583, and a case rib 4911 which protrudes from both ends of the lamp case 491 is hooked and restricted to the case fixing part 5831, and thus the door lighting unit 49 may be installed and fixed.

The lamp cover 493 is formed to extend long along the door liner 58, and includes a recessed part 4912 which is formed in the lamp cover to have a recessed space for accommodating the lamp PCB 492. Specifically, a surface of the recessed part 4912 which faces the lamp PCB 492 may be formed to be rounded, and light emitted from the lamp PCB 492 is reflected by a round surface 4913 having a predetermined curvature, and directed to the lamp case 491. A film which increases reflectivity of the light may be attached or coated on an inner surface of the recessed part 4912, in particular, the round surface 4913.

A lamp PCB installation part 4914 at which the lamp PCB 492 is installed is formed at one surface which faces the round surface 4913. The lamp PCB installation part 4914 is formed so that the lamp PCB 492 is installed and fixed in a direction crossing the lamp cover 493 at an inside of the lamp case.

An electric wire entrance hole 4915 through which access of the electric wires L connected to the lamp PCB 492 is allowed may be formed at one side of the lamp PCB installation part 4914. The electric wire entrance hole 4915 may be guided to the internal space of the sub-door 50, and may pass through the hinge shaft 511 of the sub-upper hinge 52.

The lamp cover 493 is formed so that the light reflected by the round surface 4913 of the recessed part 4912 is transmitted through the lamp cover, and also formed to shield an opening of the recessed part 4912. The lamp cover 493 is formed to be transparent or semitransparent, such that the light reflected by the round surface 4913 and uniformly spread is transmitted. The light passing through the lamp cover 493 illuminates the inside of the refrigerator in an indirect lighting method, and has a surface emitting effect.

The film may be attached to or coated on the lamp cover 493 to more effectively diffuse the light. When the lamp cover 493 is injection-molded, particles or a material which diffuses the light may be added.

The lighting unit installation part 583 at which the door lighting unit 49 is installed extends toward the inside of the opening part 403, and the lamp cover 493 radiates downward the light from an upper end of the opening part 403 when the door lighting unit 49 is installed.

Rear ends of the plurality of door baskets 43 installed at the opening part 403 are spaced apart from the rear surface of the sub-door 50, and located at the inside of the refrigerator further than the door lighting unit 49. As illustrated in FIG. 15, the light emitted downward from the door lighting unit 49 is prevented from being blocked by the door baskets 43 or the food accommodated in the door baskets 43.

A front surface of each of the door baskets 43 close to a rear end of the panel assembly 54 is formed to be inclined, and the light emitted downward from the door lighting unit 49 may be prevented from being interfered, and may also illuminate the entire opening part 403.

The door lighting unit 49 may be selectively turned on/off according to a user's operation. When the door lighting unit 49 is turned on, the accommodation space formed at the main door 40 is illuminated. When the door lighting unit 49 is turned on, and the accommodation space of the main door 40, i.e., the inside of the refrigerator becomes brighter than the outside, the light emitted from the door lighting unit 49 penetrates the sub-door 50. The user may recognize the transparent sub-door 50, and may see the accommodation space inside the main door 40 through the sub-door 50 from the outside.

The panel assembly 54 may be installed and fixed to the sub-door 50 by the support frame 60. One side of the support frame 60 may be fixed to the outer plate 55, and the other side of the support frame 60 may be bonded to the panel assembly 54 so that the panel assembly 54 is fixed to the panel installation opening 551.

The panel assembly 54 may include the front panel 541, at least one or more insulation panels 542 disposed at a rear of the front panel 541, and a spacer bar 543 which supports the front panel 541 and the insulation panel 542 and also supports between a plurality of insulation panels 542.

The front panel 541 may be formed of a glass material which is selectively see through according to the light transmittance and reflectivity, and may be referred to as a half mirror.

That is, in a state in which the door lighting unit 49 is turned on, the light inside the refrigerator penetrates the front panel 541, and the front panel 541 looks transparent. Therefore, the space inside the refrigerator located at a rear of the sub-door 50 or the accommodation space formed at the main door 40 may be seen from the outside while the sub-door 50 is closed.

When the door lighting unit 49 is turned off, the light does not penetrate the front panel 541, but is reflected, and the front panel 541 serves as a mirror surface. In this state, the space inside the refrigerator located at the rear of the sub-door 50 or the accommodation space formed at the main door 40 may not be seen from the outside.

The front panel 541 may be surface-treated in various methods so that a half mirror effect is provided at the front panel 541. For example, a titan compound may be vacuum-deposited on a front surface of a glass layer forming the front panel 541.

A silk-screen printing may be performed on a rear surface of the glass layer forming the front panel 541 using a titan compound ($TiO_2$)-based printing ink which includes a resin for adjusting viscosity, an organic solvent and an additive, and thus a ceramic printed layer may be formed.

In some examples, a hard coating layer configured with triple layers of iron, cobalt and chrome may be formed on the rear surface of the glass layer forming the front panel 541 using an atmospheric pressure chemical vapor deposition (APCAVD) method or a spraying method in which a liquid coating material is sprayed.

When the ceramic printed layer or the hard coating layer is formed on the rear surface of the glass layer, the front panel 541 may be formed to have a light transmittance of 20% to 30% from the outside. When the transmittance is 20% or less, it is not easy to see through the inside from the outside even when the door lighting unit 49 is turned on, and when the transmittance is 30% or more, the front surface of the panel assembly 54 does not look like the mirror surface, and a part of the inside of the refrigerator may be seen through.

The bezel 5411 which is formed along the perimeter of the rear surface of the front panel 541 may be formed so that the light is not transmitted through it, and an edge of the front panel 541 at which the bezel 5411 is provided is formed to extend outward further than the insulation panel 542. Therefore, at the rear surface of the front panel 541 at which the bezel 5411 is formed, the support frame 60, the heater 59 and the spacer bar 543 are provided so as not to be exposed forward through the front panel 541.

The knock detection device 82 may be disposed at the bezel 5411 which is formed at a lower end of the front panel 541. Therefore, the knock detection device 82 may also be covered by the bezel 5411 so as not to be exposed to the outside.

Specifically, the support frame 60 is disposed at an area of the bezel 5411 to fix the panel assembly 54. The heater 59 fixed by the support frame 60 may also be located at the area of the bezel 5411. Therefore, all of the heater 59 and the support frame 60 which are disposed along an edge of the panel assembly 54 are covered by the bezel 5411 and thus not exposed to the outside.

The spacer bar 543 is formed at the perimeter of the rear surface of the front panel 541. The spacer bar 543 serves to enable the front panel 541 and the insulation panel 542 to be spaced apart from each other, and also to seal the space between the front panel 541 and the insulation part 542.

The spacer bar 543 may also be disposed between the plurality of insulation panels 542. The front panel 541, the insulation panel 542 and the plurality of spacer bars 543 may be bonded to each other by an adhesive, and a sealant may be coated to seal an outer surface of the panel assembly 54 and among the front panel 541, the insulation panel 542 and the spacer bar 543.

The insulation panel 542 may be formed to have a size smaller than that of the front panel 541, and may be located within an internal area of the front panel 541. The insulation panel 542 may be chemical strengthening glass in which glass is soaked in an electrolyte solution at a glass transition temperature or more, and chemically strengthened.

A low-radiation coating layer for reducing heat transfer into the storage compartment due to radiation may be formed at a rear surface of the insulation panel 542. Glass on which the low-radiation coating layer is formed is referred to as low-c glass. The low-radiation coating layer may be formed by sputtering silver or the like on a surface of the glass.

A sealed space between the front panel 541 and the insulation panel 542 and a sealed space between the plurality of insulation panels 542 which are formed by the spacer bar 543 may create a vacuum state so as to be insulated.

In some examples, an inert gas for the insulation, such as argon, may be filled in the sealed space between the front panel 541 and the insulation panel 542 and the sealed space between the plurality of insulation panels 542. Insulation performance may be ensured by forming a predetermined space between the front panel 541 and the insulation panel 542 and between the plurality of insulation panels 542 in which the inert gas is filled since inert gases have a better insulation property than air.

The insulation panel 542 may be formed in a single panel, and may be installed to be spaced apart from the front panel 541. Two or more insulation panels 542 may be provided to be spaced apart from each other.

Figure 17:
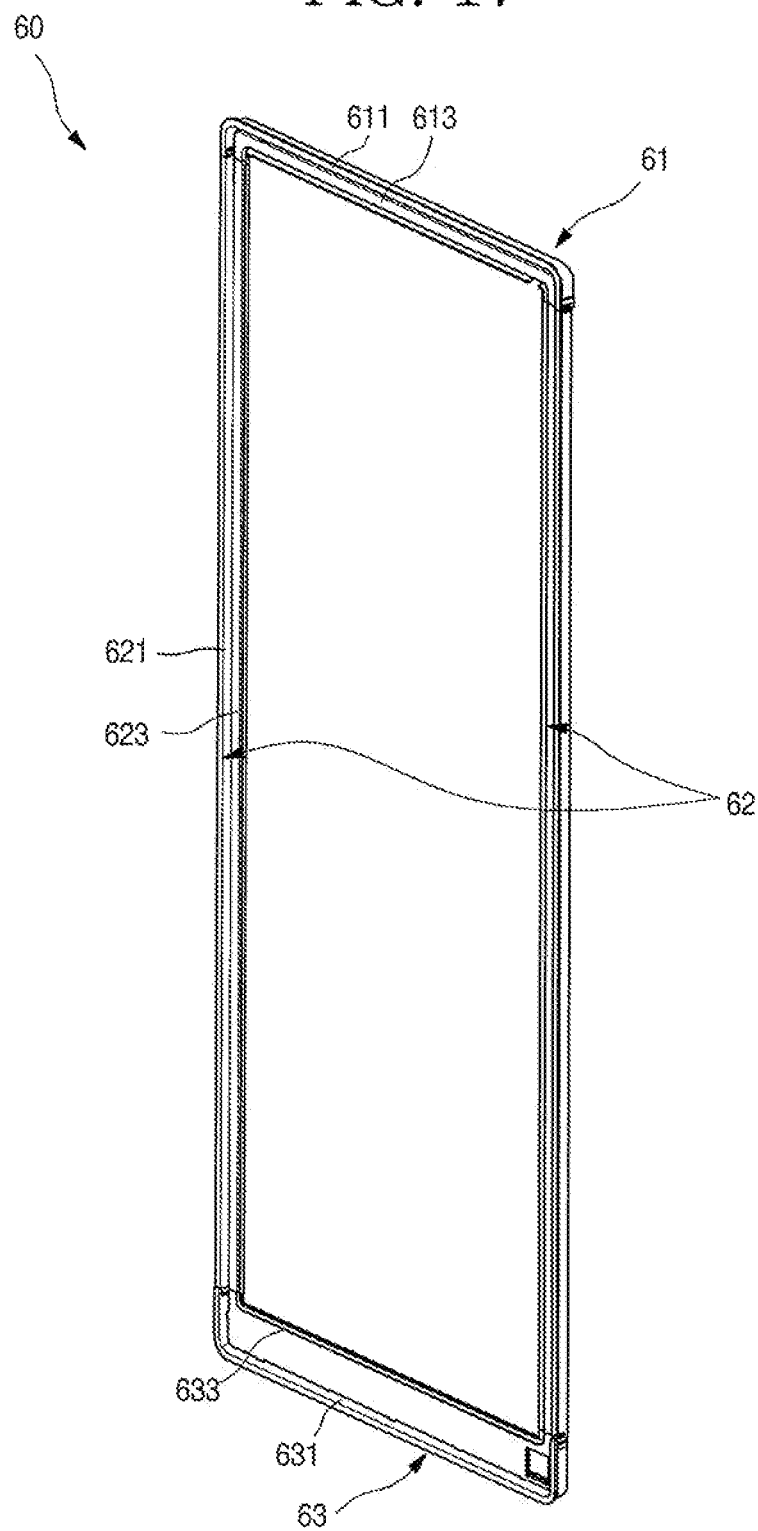
FIG. 17 is a perspective view of an example of a support frame

As illustrated in in FIG. 17, the support frame 60 may be formed so that the upper frame 61 and the lower frame 63 are disposed up and down, and the pair of side frames 62 connect between the upper frame 61 and the lower frame 63, and thus may be formed to have a quadrangular shape.

The support frame 60 may be injection molded with a plastic material. The support frame 60 may be formed so that the plate bent part 552 of the outer plate 55 is inserted into the support frame 60 while the support frame 60 is assembled, and may also be formed so that the heater 59 is fixed to the frame 60.

Specifically, plate insertion parts 611, 621 and 631 in which the plate bent part 552 is inserted may be formed at the assembled support frame 60. The plate insertion parts 611, 621 and 631 may be formed along an entire perimeter of the support frame 60. A plurality of restricting protrusions 612, 622 and 632 may be formed at the plate insertion parts 611, 621 and 631 to be spaced apart from each other at regular intervals. A plurality of holes 614, 624 and 634 corresponding to the restricting protrusions 612, 622 and 632 may be formed at the plate insertion parts 611, 621 and 631 so that the foaming solution is easily introduced into the plate insertion parts 611, 621 and 631. The restricting protrusions 612, 622 and 632 may be formed at positions corresponding to the plurality of holes 614, 624 and 634, and thus the restricting protrusions 612, 622 and 632 may be easily molded during an injection molding.

Heater grooves 613, 623 and 633 may be formed at the support frame 60 to correspond to an arrangement of the heater 59, and the heater 59 may be installed.

An entire width of the support frame 60 is formed to be covered by the bezel 5411 provided at the panel assembly 54, and may be formed to extend to an outer end of the insulation panel 542.

Figure 18:
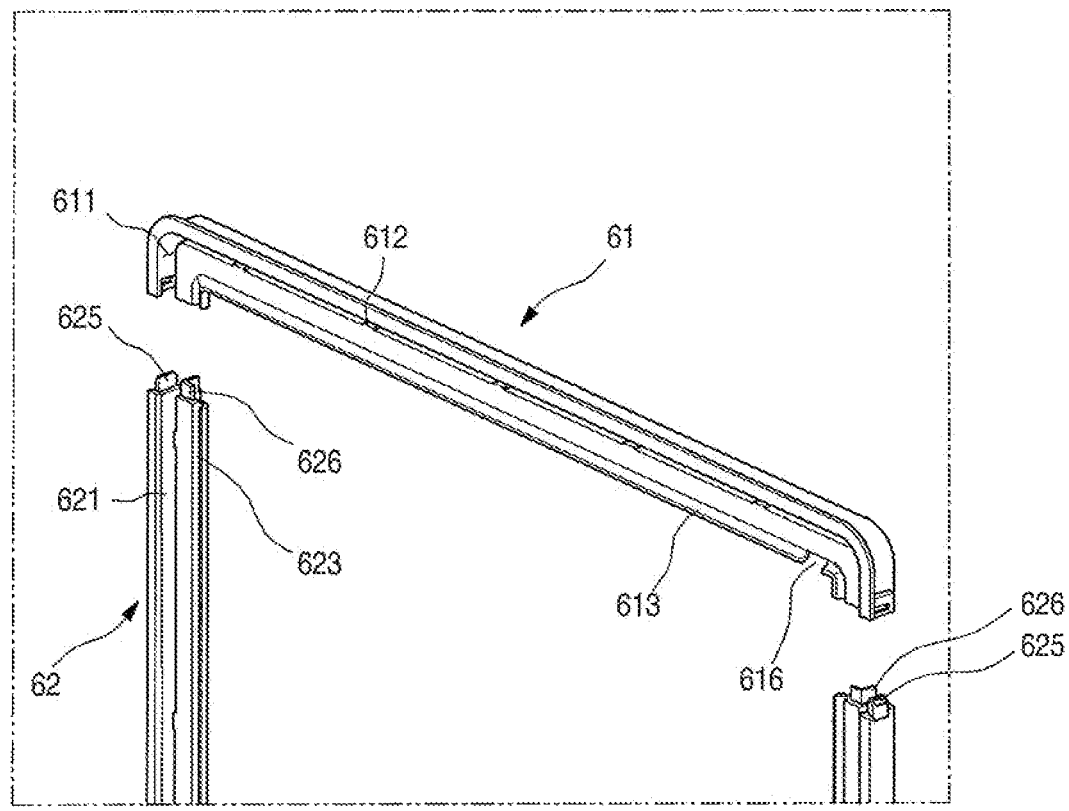
FIG. 18 is an exploded perspective view illustrating a coupling structure of an upper portion of the support frame.
Figure 19:
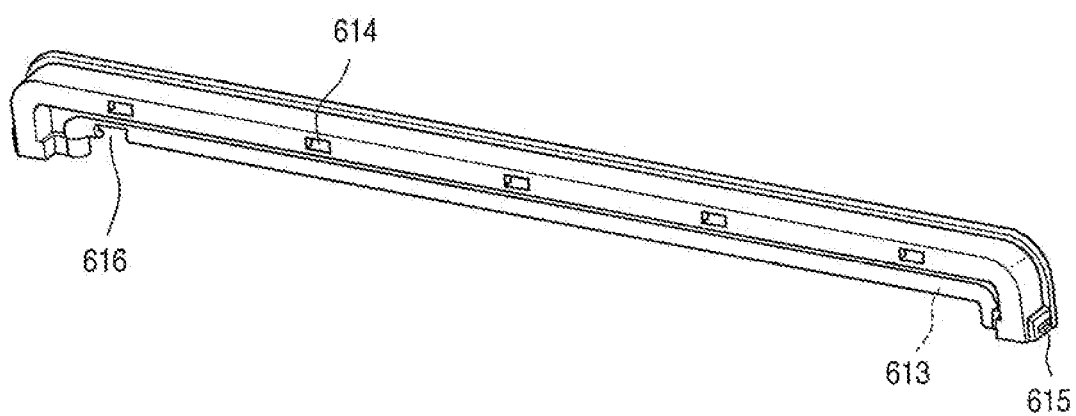
FIG. 19 is a perspective view of an upper frame forming the support frame.

As illustrated in FIGS. 18 and 19, the upper frame 61 forms an upper portion of the support frame 60. Both ends of the upper frame 61 are bent downward, and may be coupled to upper ends of the side frames 62. To this end, both ends of the upper frame 61 may be bent downward, and then may be opened. An upper hook groove 615 in which a side hook 625 formed at the upper end of the side frame 62 is inserted may be formed at each of both ends of the upper frame 61.

An upper insertion part 611 may be formed to be recessed from one surface of the upper frame 61 which is in contact with the rear surface of the outer plate 55. The upper insertion part 611 is formed so that a portion of the plate bent part 552 which forms an upper end of the panel installation opening 551 is inserted therein.

The upper insertion part 611 may be formed to have a thickness greater than that of the outer plate 55 and a protruding height of an upper restricting protrusion 612 formed at the upper insertion part 611. Therefore, the plate bent part 552 may be inserted into the upper insertion part 611, and then the upper restricting protrusion 612 may be inserted into the plate hole 5521, and thus the outer plate 55 and the upper frame 61 may be coupled to each other.

An upper heater groove 613 may be formed at an inner side further than the upper insertion part 611, i.e., at an opening side of the support frame 60, and thus may accommodate an upper portion of the heater 59 which is disposed along the edge of the front panel 541. An electric wire entrance part 616 is formed at one side of the upper heater groove 613, and thus the electric wire L connected to the heater 59 may enter therethrough.

An upper hole 614 may be further formed at the upper insertion part 611 corresponding to the upper restricting protrusion 612, and the foaming solution for forming the insulation may be injected through the upper hole 614, and may be filled inside the upper insertion part 611 of the upper frame 61.

Figure 20:
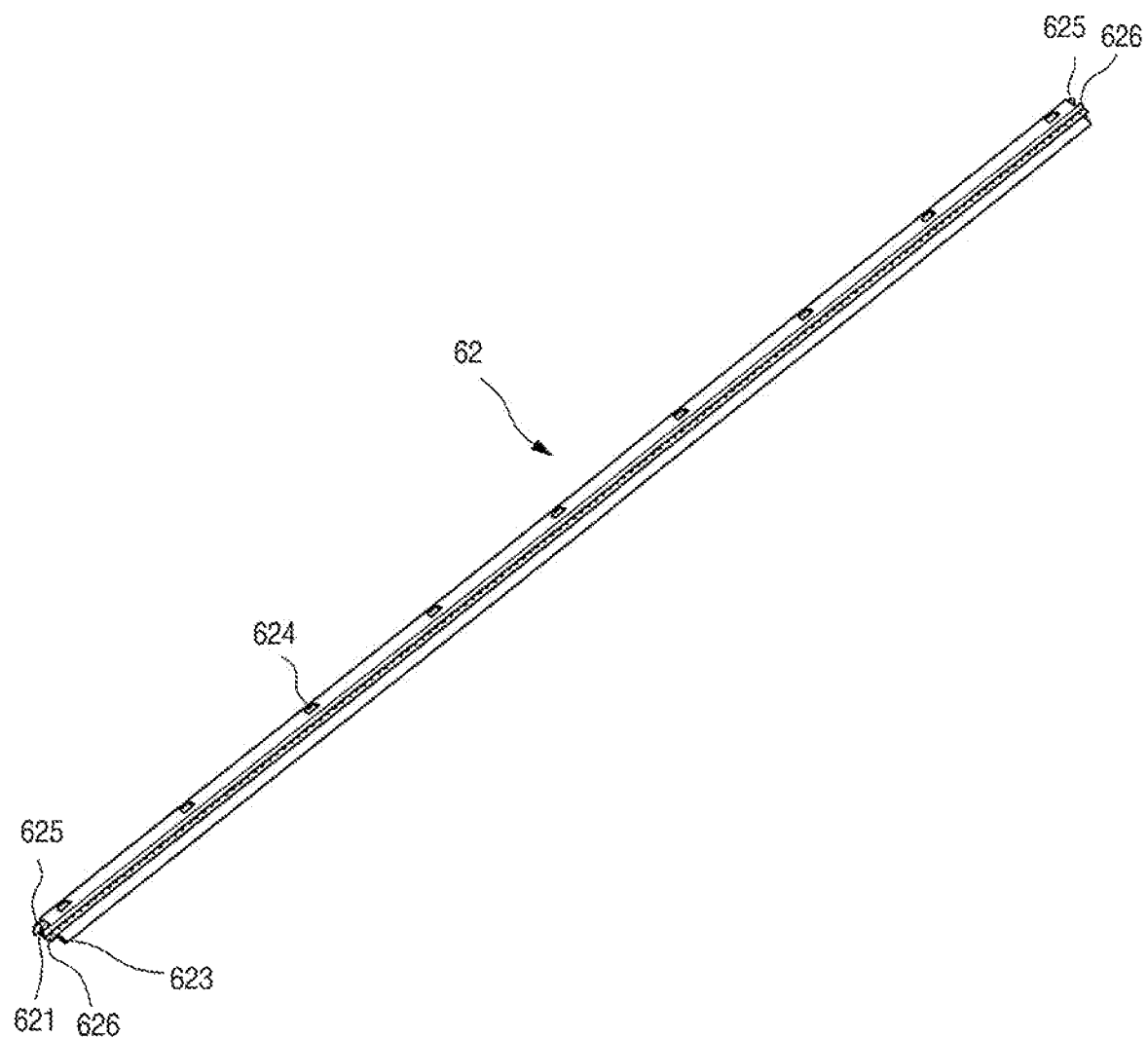
FIG. 20 is a perspective view of a side frame forming the support frame when being from a front.
Figure 21:
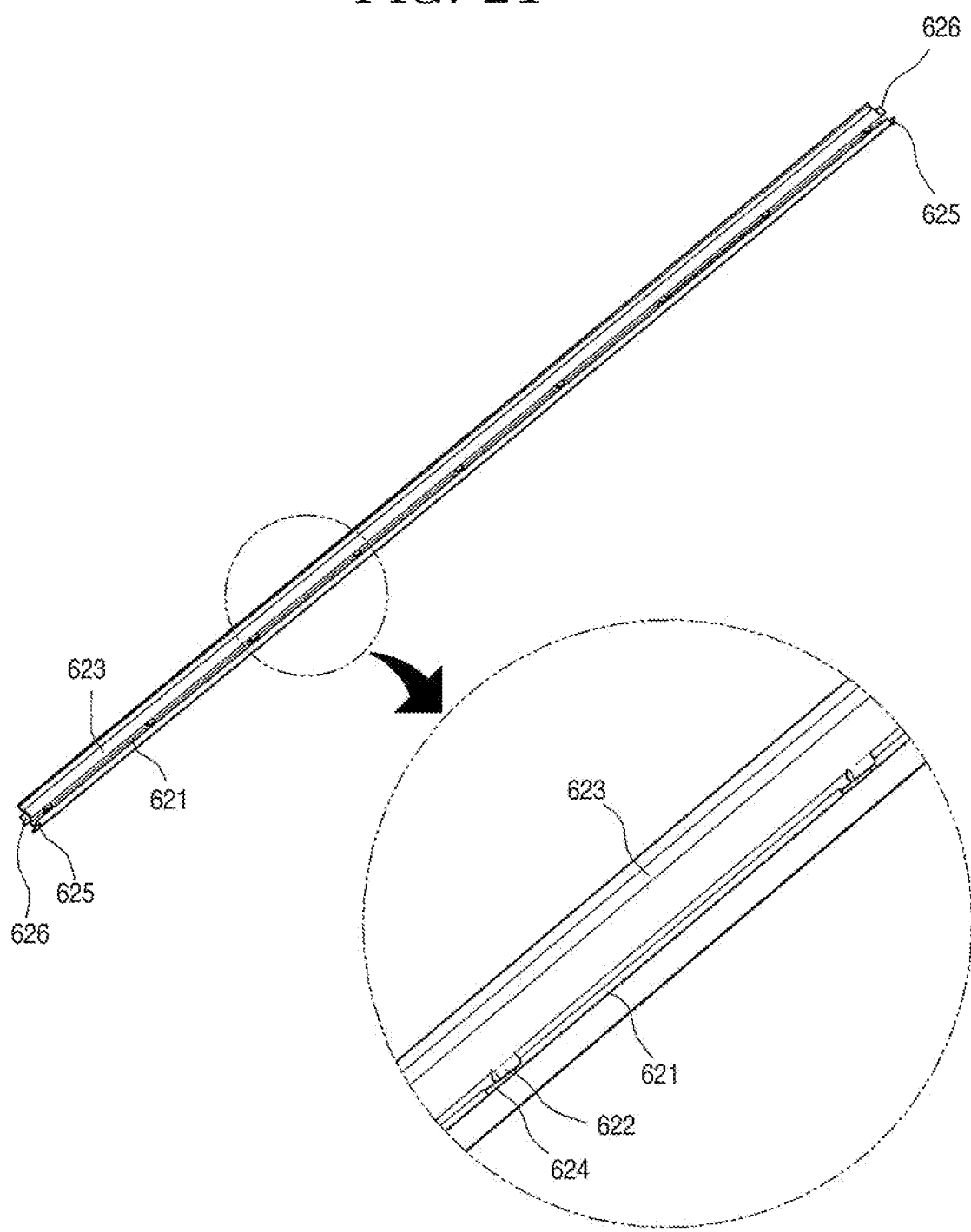
FIG. 21 is a perspective view of the side frame forming the support frame when being from a rear.

As illustrated in FIGS. 20 and 21, the side frames 62 form both side surfaces of the support frame 60. Each of the side frames 62 is formed to have a length which connects between the upper frame 61 and the lower frame 63. To this end, the side hook 625 is formed at an upper end and a lower end of each of the side frames 62. The side hook 625 may be coupled to the upper hook groove 615 of the upper frame 61 and a lower hook groove 635 of the lower frame 63.

Side ribs 626 which are inserted into the upper insertion part 611 of the upper frame 61 and a lower insertion part 631 of the lower frame 63 may be formed at the upper end and the lower end of each of the side frames 62, respectively. Therefore, the side frames 62, the upper frame 61 and the lower frame 63 may be maintained in a stably coupled state to each other.

A side insertion part 621 may be formed to be recessed from one surface of each of the side frames 62 in contact with the rear surface of the outer plate 55. The side insertion part 621 may be formed to be inserted into a portion of the plate bent part 552 which forms both side ends of the panel installation opening 551.

At this time, the side insertion part 621 may be formed to have a thickness greater than that of the outer plate 55 and a protruding height of a side restricting protrusion 622 formed at the side insertion part 621. Therefore, the plate bent part 552 may be inserted into the side insertion part 621, and then the side restricting protrusion 622 may be inserted into the plate hole 5521, and the outer plate 55 and the side frames 62 may be coupled to each other.

A side heater groove 623 may be formed at an inner side further than the side insertion part 621, and may accommodate a side portion of the heater 59 which is disposed along the edge of the front panel 541.

Meanwhile, a side hole 624 may be further formed at the side insertion part 621 corresponding to the side restricting protrusion 622, and the foaming solution may be injected through the side hole 624, and may be fully filled inside the side insertion part 621 of each of the side frames 62.

Figure 22:
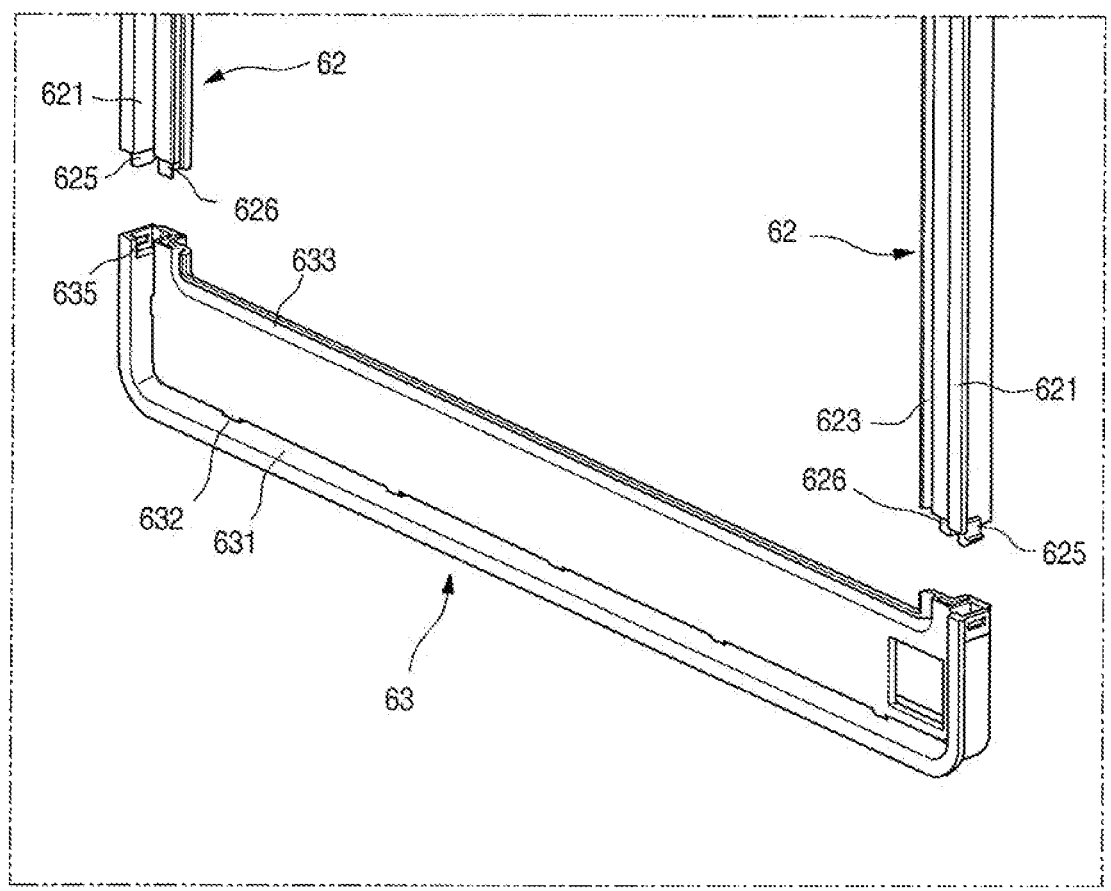
FIG. 22 is an exploded perspective view illustrating a coupling structure of a lower portion of the support frame.
Figure 23:
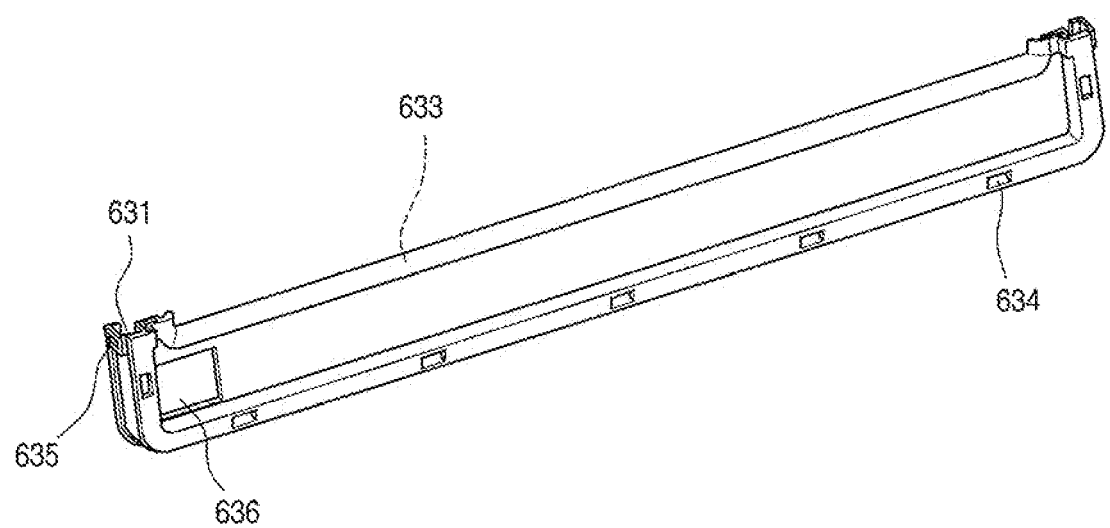
FIG. 23 is a perspective view of a lower frame forming the support frame.

As illustrated in FIGS. 22 and 23, the lower frame 63 forms a lower portion of the support frame 60. Both ends of the lower frame 63 are bent upward, and may be coupled to lower ends of the side frames 62. To this end, both ends of the lower frame 63 may be bent upward, and then may be opened. The lower hook groove 635 in which the side hook 625 formed at the lower end of the side frame 62 is inserted may be formed at each of both ends of the lower frame 63.

The lower insertion part 631 may be formed to be recessed from one surface of the lower frame 63 which is in contact with the rear surface of the outer plate 55. The lower insertion part 631 is formed so that a portion of the plate bent part 552 which forms a lower end of the panel installation opening 551 is inserted into the lower insertion part 631.

The lower insertion part 631 may be formed to have a thickness greater than that of the outer plate 55 and a protruding height of a lower restricting protrusion 632 formed at the lower insertion part 631. Therefore, the plate bent part 552 may be inserted into the lower insertion part 631, and then the lower restricting protrusion 632 may be inserted into the plate hole 5521, and thus the outer plate 55 and the lower frame 63 may be coupled to each other.

A lower heater groove 633 may be formed at an inner side further than the lower insertion part 631, and may accommodate a lower end of the heater 59 which is disposed along the edge of the front panel 541.

Meanwhile, a lower hole 634 may be further formed at the lower insertion part 631 corresponding to the lower restricting protrusion 632, and the foaming solution may be injected through the lower hole 634, and thus may be fully filled inside the lower insertion part 631 of the lower frame 63, and the insulation may be formed.

A detection device hole 636 through which the knock detection device 82 which will be described below in detail is exposed is formed at one side of the lower frame 63. Therefore, the knock detection device 82 may be provided at a rear of the lower frame 63, and may be in close contact with the rear surface of the front panel 541 through the detection device hole 636.

Referring to FIGS. 24-27, all of the upper frame 61, the side frames 62 and the lower frame 63 are attached to a protruding edge of the front panel 541. The upper frame 61, the side frames 62 and the lower frame 63 may be bonded to the rear surface of the front panel 541, at which the bezel 5411 is formed, by an adhesive sheet 5412 or an adhesive.

Ends of the upper frame 61, the side frames 62 and the lower frame 63 may extend to an outer end of the insulation panel 542. The upper heater groove 613, the side heater groove 623 and the lower heater groove 633 are formed at the ends of the upper frame 61, the side frames 62 and the lower frame 63, and thus the edge of the front panel 541 of which a temperature of the rear surface thereof is relatively lower than that of the front surface thereof may be heated. And an aluminum sheet 5413 having a predetermined width may be disposed between the heater 59 and the front panel 541. Therefore, when the heater 59 generates heat, an area at which the bezel 5411 of the front panel 541 is formed may be equally heated.

The plate bent part 552 of the outer plate 55 is inserted into the upper insertion part 611, the side insertion part 621 and the lower insertion part 631 of the upper frame 61, the side frame 62 and the lower frame 63 which are attached to the front panel 541.

Figure 24:
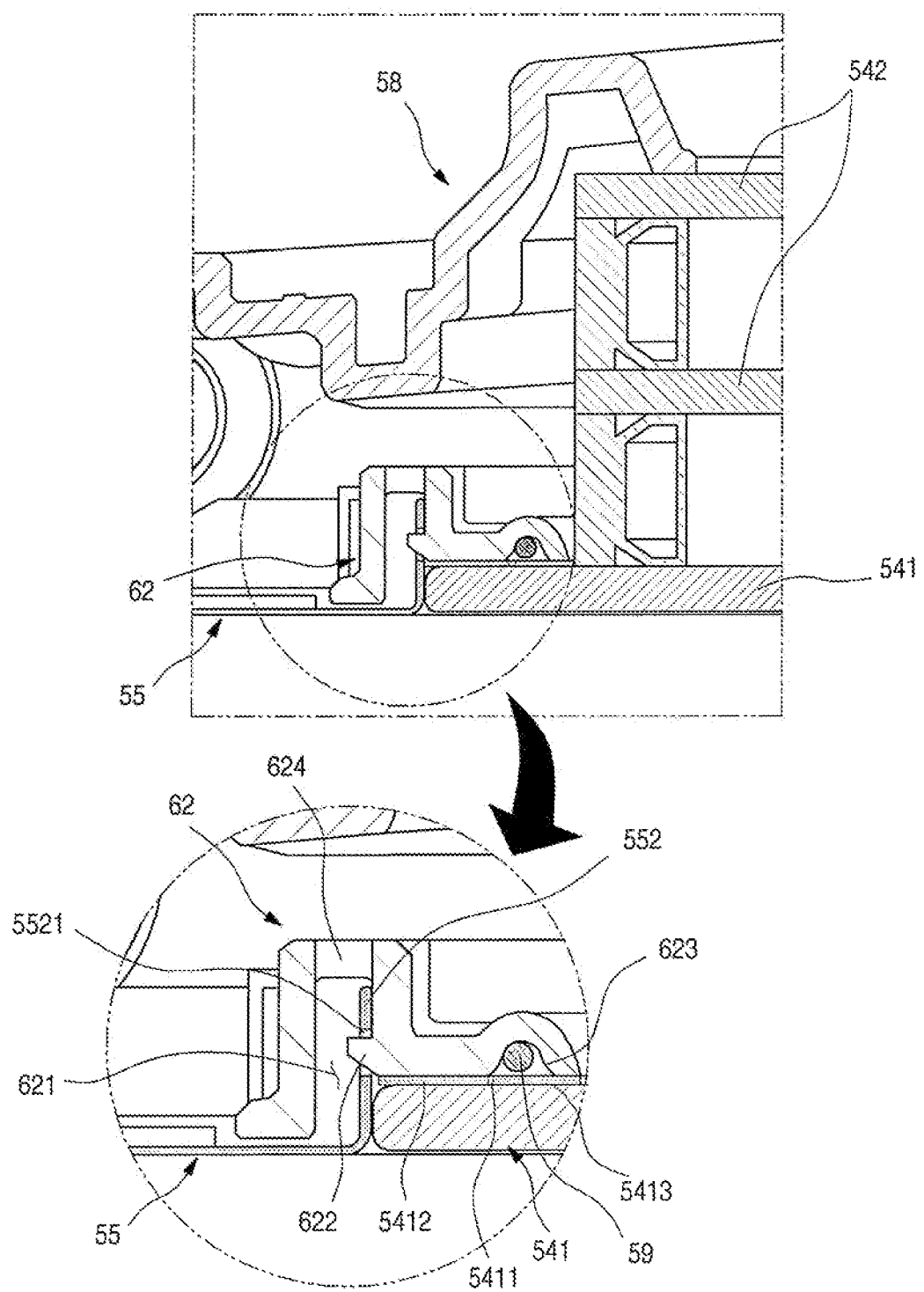
FIG. 24 is a cross-sectional view taken along line 24-24' of FIG. 12.
Figure 25:
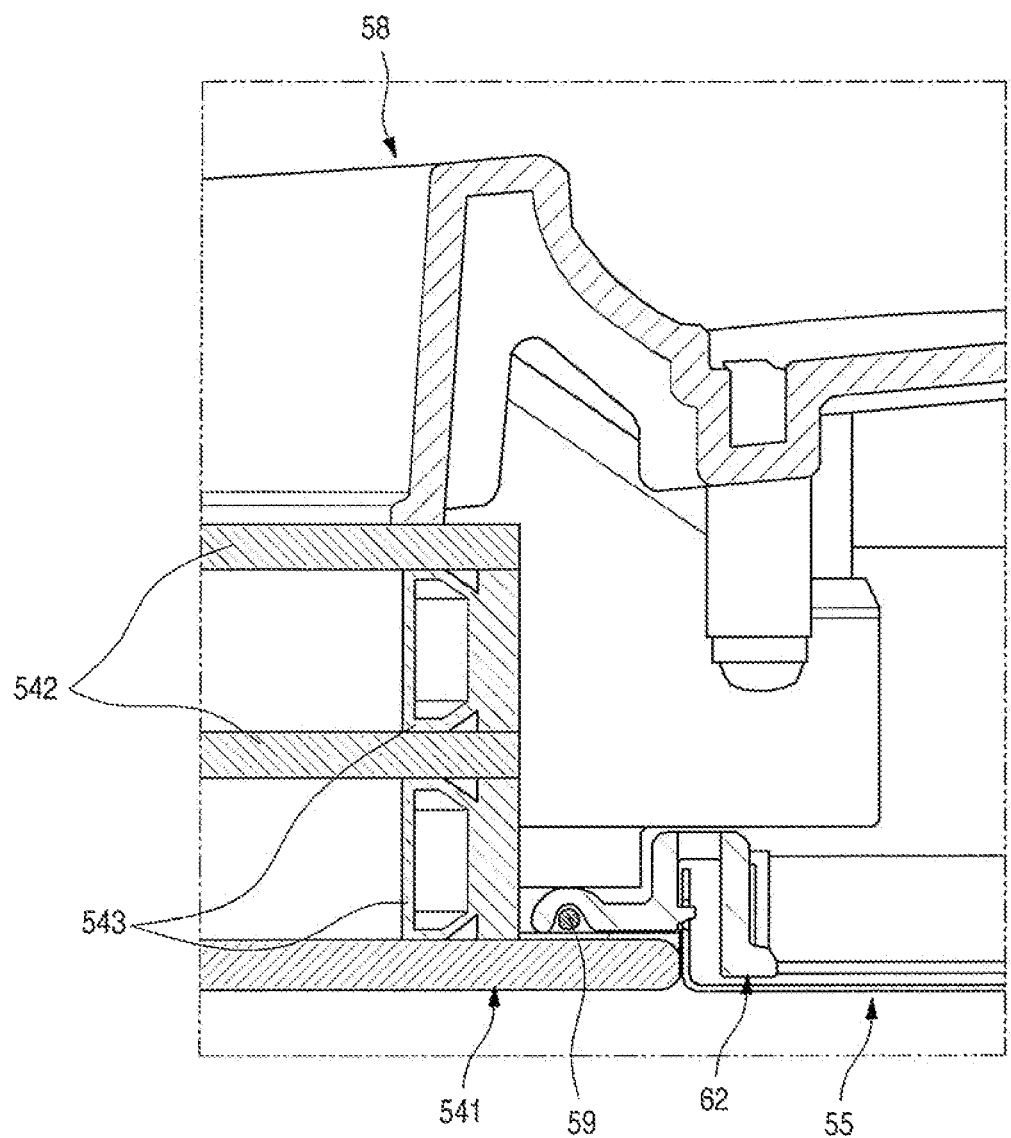
FIG. 25 is a cross-sectional view taken along line 25-25' of FIG. 12.
Figure 26:
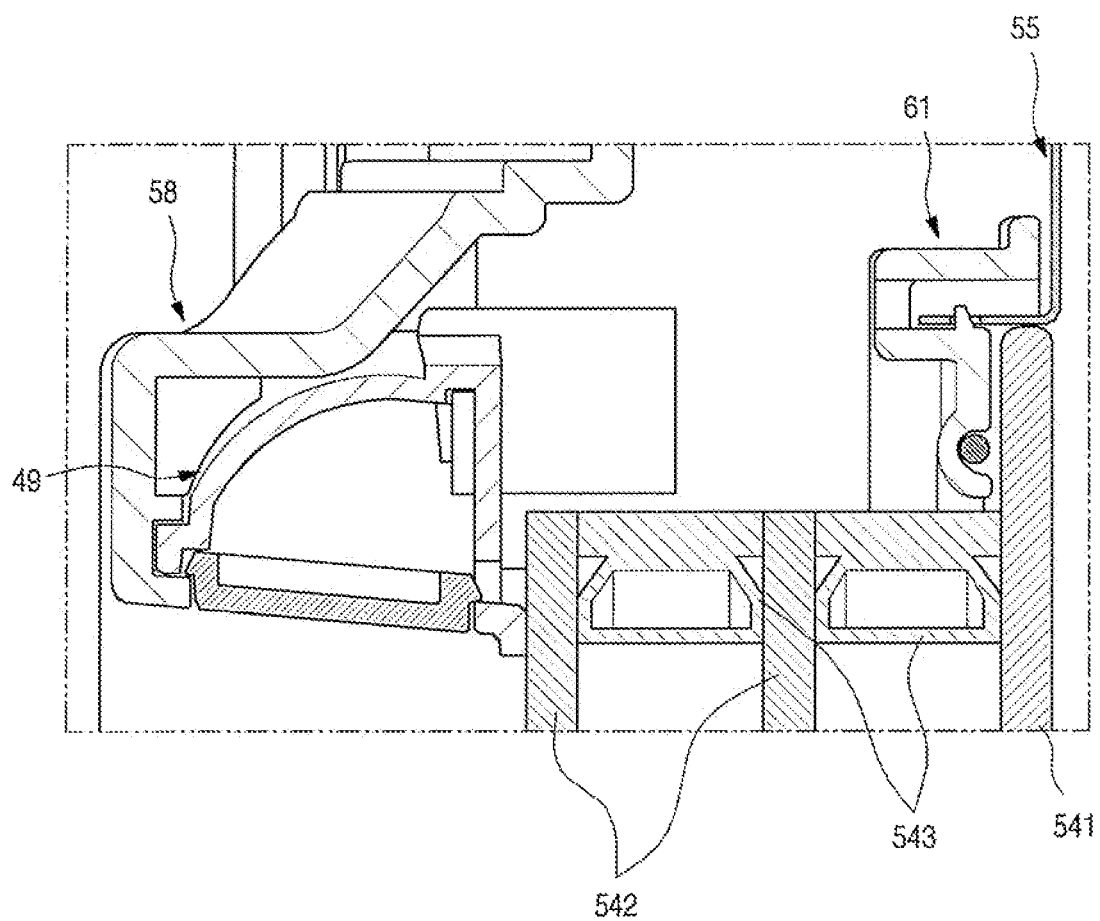
FIG. 26 is a cross-sectional view taken along line 26-26' of FIG. 12.
Figure 27:
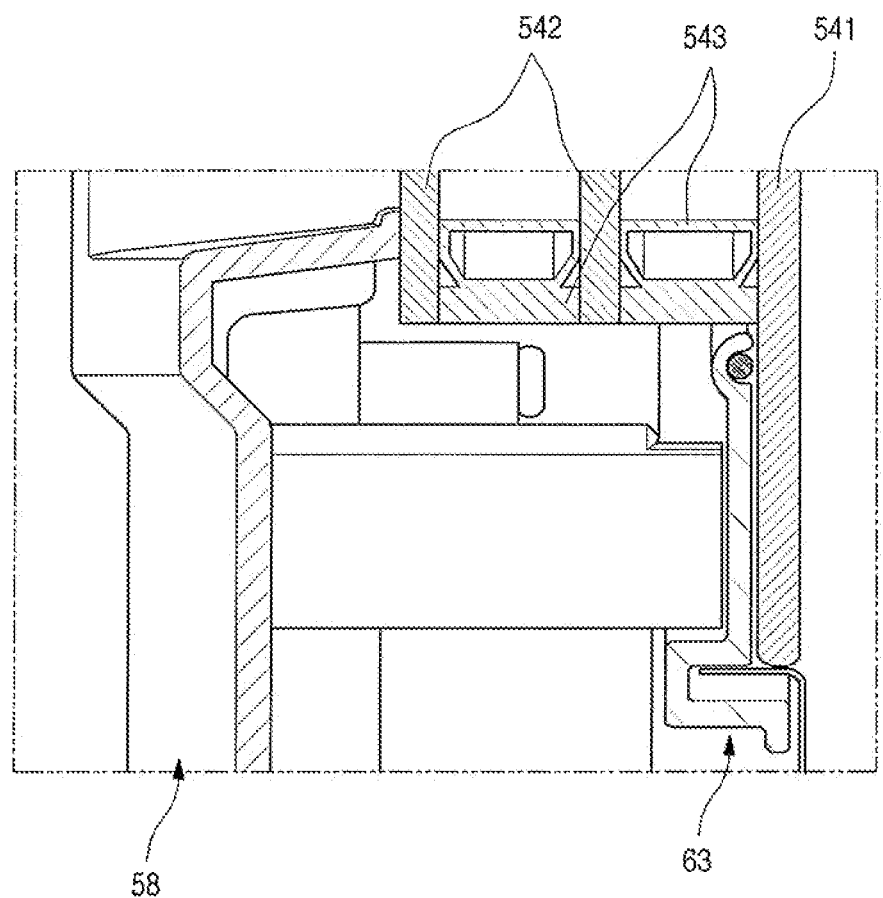
FIG. 27 is a cross-sectional view taken along line 27-27' of FIG. 12.

As illustrated in FIG. 24, the plate bent part 552 is in close contact with the front panel 541 while being inserted into the side insertion part 621. The plate hole 5521 of the plate bent part 552 is hooked and restricted to the side restricting protrusion 622, and thus the outer plate 55 and the side frames 62 may be coupled and fixed to each other.

The foaming solution may be introduced into the side insertion part 621 through the side hole 624, and the introduced foaming solution may enable the plate bent part 552 to be in close contact with the front panel 541.

Due to such a structure, the plate bent part 552 formed at the outer plate 55 may be in close contact with an outer end of the front panel 541. Therefore, when seen from a front, a gap between an end of the outer plate 55 forming the panel installation opening 551 and the outer end of the front panel 541 may be minimized.

Figure 28:
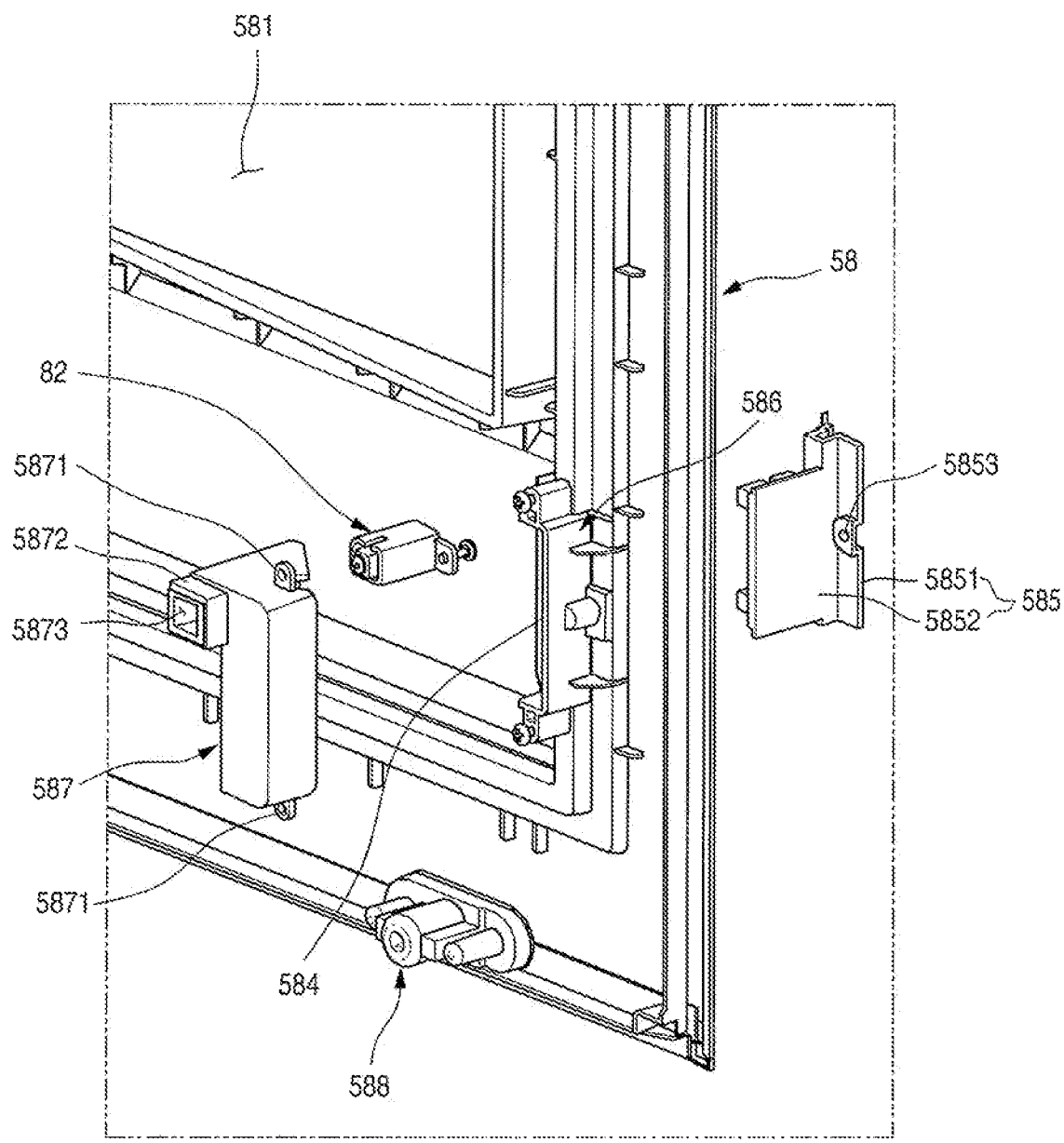
FIG. 28 is an exploded perspective view illustrating an example of a coupling structure of a knock detection device when being seeing from a front.
Figure 29:
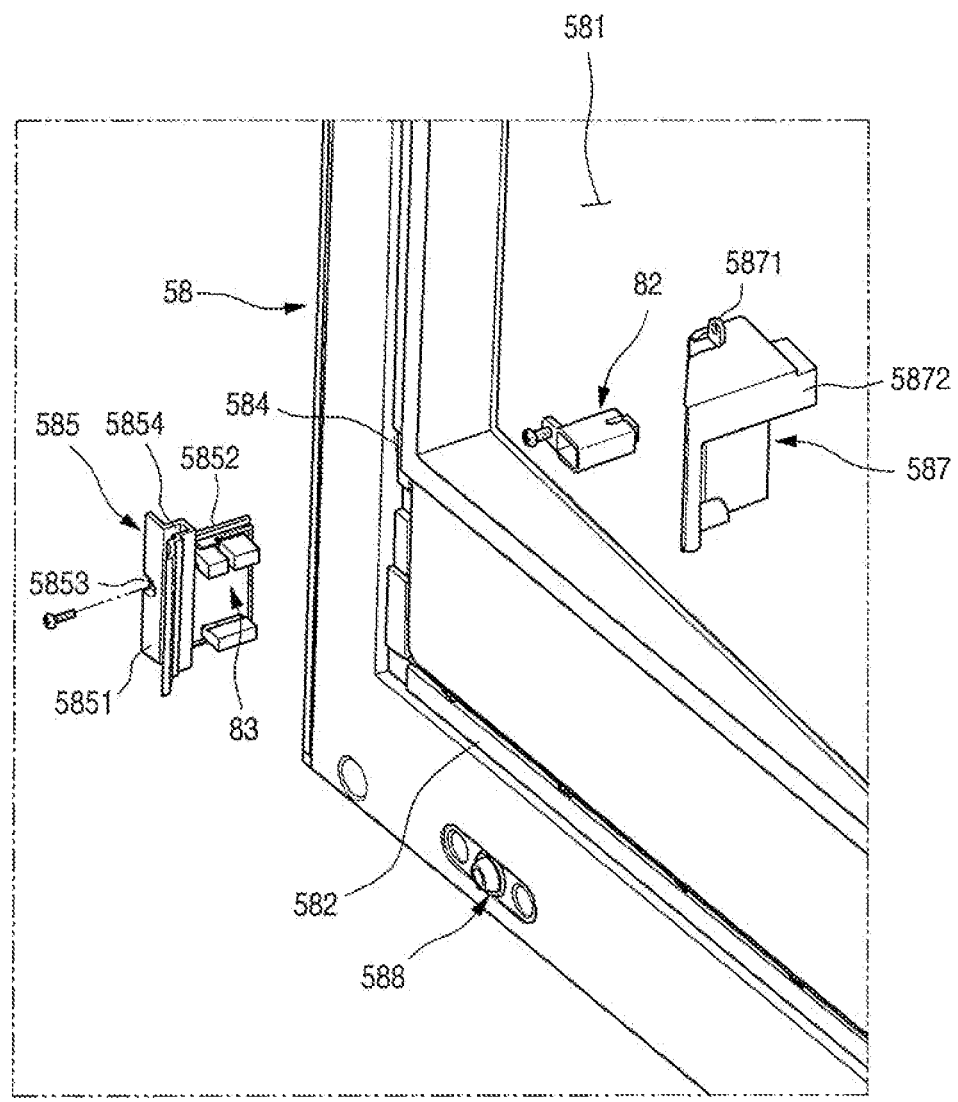
FIG. 29 is an exploded perspective view illustrating the coupling structure of the knock detection device when being seeing from a rear.
Figure 30:
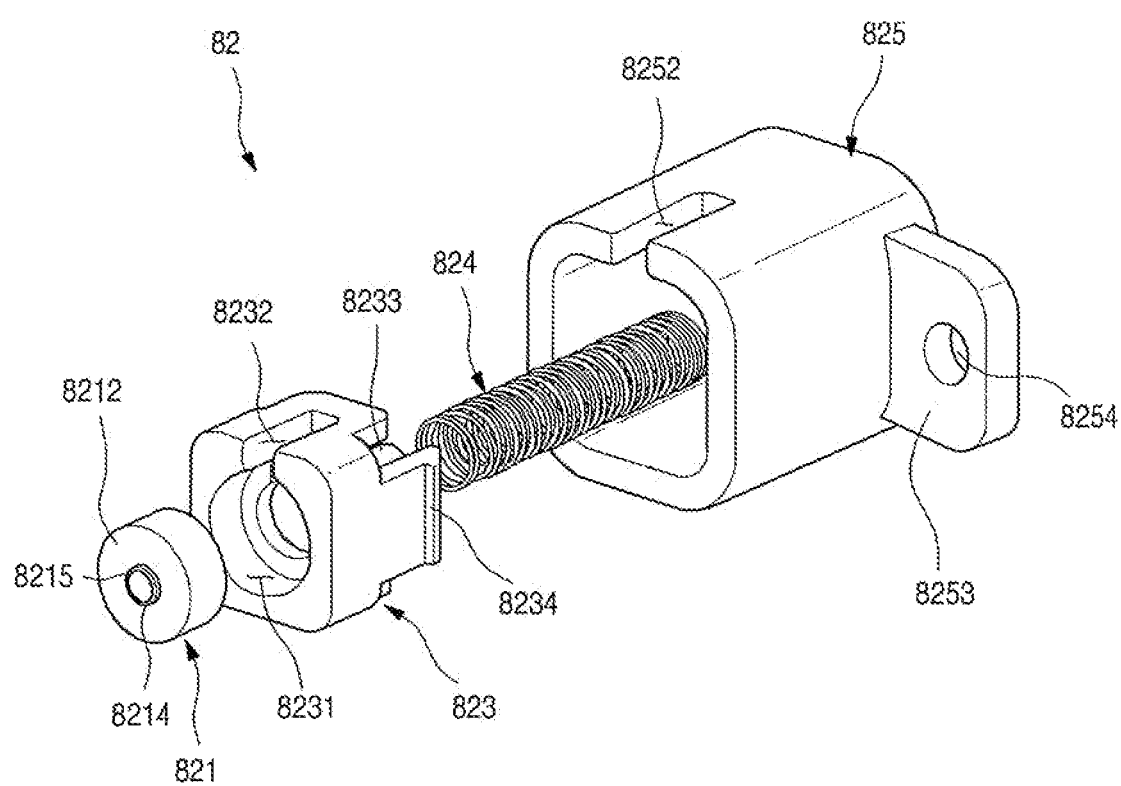
FIG. 30 is an exploded perspective view of the knock detection device.
Figure 31:
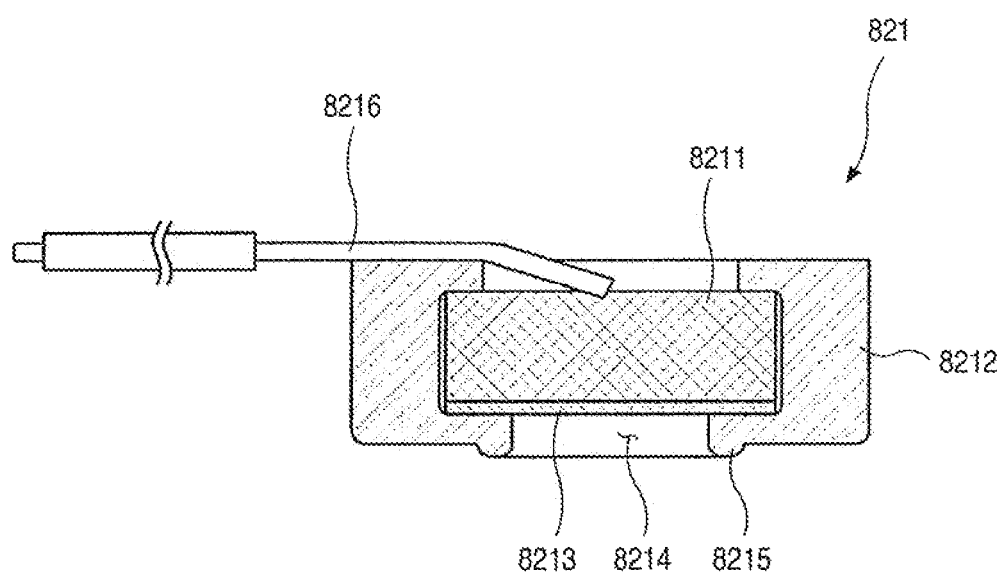
FIG. 31 is a cross-sectional view illustrating a microphone structure of the knock detection device.
Figure 32:
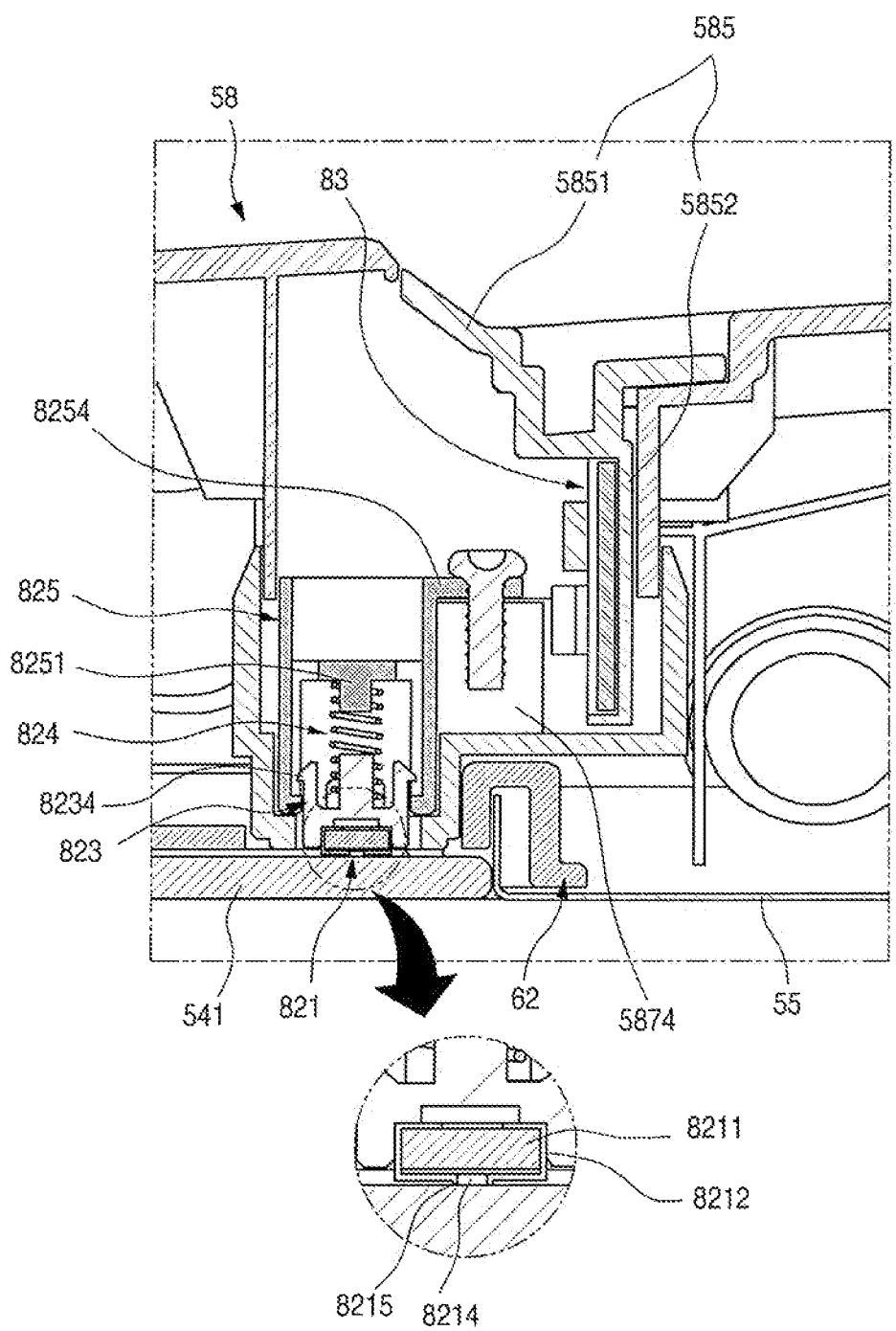
FIG. 32 is a cross-sectional view taken along line 32-32' of FIG. 12.

As illustrated in FIGS. 28 and 29, a sensor opening 584 in which the knock detection device 82 is inserted is formed at a lower portion of the door liner 58. The sensor opening 584 is formed so that the knock detection device 82 is inserted from an outside. A detection device PCB 83 for processing a knock detecting signal of the knock detection device 82 may be formed to have a shape corresponding to an insert cover 585 which will be installed, and may be shielded by the insert cover 585.

In a state in which the insert cover 585 is installed, an outer surface of the insert cover 585 has the same shape as that of an outer surface of the door liner 58. Therefore, the insert cover 585 is installed at a position through which the liner groove 582 formed at the door liner 58 passes, and a cover groove 5854 which is connected with the liner groove 582 is formed at the insert cover 585. Therefore, the sub-gasket 591 may be installed to pass through the liner groove 582 and the cover groove 5854.

A detection device accommodating part 586 may be formed along a perimeter of the sensor opening 584. The detection device accommodating part 586 forms a part of a space which accommodates the knock detection device 82, is formed to extend toward the outer plate 55, and coupled to an accommodating part case 587 so as to form a space for accommodating the knock detection device 82.

The accommodating part case 587 is coupled to a front end of the detection device accommodating part 586, and forms a remaining space for accommodating the knock detection device 82. A case coupling part 5871 to which a screw is fastened is formed at both ends of the accommodating part case 587, and thus the accommodating part case 587 may be coupled and fixed to the detection device accommodating part 586.

A detection device inserting part 5872 in which a front end of the knock detection device 82 is inserted is formed at the accommodating part case 587. An insertion part hole 5873 is formed at a front surface of the detection device inserting part 5872, and the detection device inserting part 5872 is inserted into the detection device hole 636. Therefore, a front surface of the knock detection device 82 which is inserted into the detection device inserting part 5872 may pass through the insertion part hole 5873 and the detection device hole 636, and may be in close contact with the rear surface of the front panel 541.

An end of the detection device accommodating part 586 and an end of the accommodating part case 587 which are in contact with each other may be formed to have slopes corresponding to each other, and thus may be coupled to each other with orientation. Due to coupling between the detection device accommodating part 586 and the accommodating part case 587, a space in which the knock detection device 82 and the detection device PCB 83 are installed is formed inside the sub-door 50.

While the detection device accommodating part 586 and the accommodating part case 587 are coupled to each other, the detection device accommodating part 586 and the accommodating part case 587 form a space independent from the space inside the sub-door 50 in which the foaming solution is injected. Therefore, the user may insert and install the knock detection device 82 through the sensor opening 584 after a foaming process is performed at the sub-door 50.

Meanwhile, the insert cover 585 may include a cover part 5851 which shields the sensor opening 584, and a PCB insertion part 5852 in which the detection device PCB 83 is installed. The cover part 5851 is formed to have a shape corresponding to the sensor opening 584 and to shield the sensor opening 584, and forms a part of an exterior of the door liner 58. And a screw hole 5853 may be formed at one side of the cover part 5851, and the cover part 5851 may be fixed to the door liner 58 by a screw.

The PCB insertion part 5852 is formed to extend from the cover part 5851, and also formed to be inserted into the detection device accommodating part 586 when the insert cover 585 is inserted. The cover part 5851 may be formed corresponding to a size of the detection device PCB 83 so that the insert cover 585 is inserted and installed into the sensor opening 584 while the detection device PCB 83 is installed. The electric wire L which is connected to the knock detection device 82 may be connected to the adjacent detection device PCB 83. Since the detection device PCB 83 may be disposed at a lateral side of the knock detection device 82, the detection device PCB 83 may be connected to the knock detection device 82 in a short distance.

In the case in which the detection device PCB 83 for processing the signal is located at a distance, there may be a problem that noise generated when the signal to be processed is transferred through a signal line may be increased. However, since the detection device PCB 83 is located at a position at which the knock detection device 82 is installed, the main control part 2 receives only a valid knock-on signal. Accordingly, the noise due to the signal line between the main control part 2 and the detection device PCB 83 may be minimized. That is, the main control part 2 may receive the signal of which the noise is minimized through the detection device PCB 83. Therefore, it is possible to ensure an accurate recognition rate.

In particular, in the case of the knock detection device 82, a signal output through a microphone 8211 is indicated by mV unit, but the main control part 2 which controls an entire operation of the refrigerator generally receives a signal which is basically indicated by V unit. Therefore, due to a scale difference in a physical signal, it is not preferable that the main control part 2 determines whether the knock-on signal is normal.

The refrigerator is an electronic appliance using a high voltage/a high current. Therefore, an electrical noise generation amount is relatively great. This means that the signal of mV unit output from the microphone 8211 may be further vulnerable to the electrical noise.

Therefore, since the detection device PCB 83 is located close to the knock detection device 82, the noise may be remarkably reduced, and thus the recognition rate may be enhanced.

Referring to FIGS. 30-33, a structure of the knock detection device 82 will be described in detail. The knock detection device 82 is a device which detects a user's knocking operation on the sub-door 50.

The knock detection device 82 may include a microphone module 821 which detects the knock-on signal, a holder 823 which accommodates the microphone module 821, an elastic member 824 which presses the holder 823 and the microphone module 821 toward the front panel 541 so that the holder 823 and the microphone module 821 are in close contact with the front panel 541, and a support member 825 which supports the elastic member 824 and the holder 823.

The microphone module 821 includes the microphone 8211 which directly senses a sound wave, and a microphone accommodation part 8212 which accommodates the microphone 8211. The microphone 8211 serves to directly sense the sound wave, is formed in a circular shape having a predetermined thickness, and installed and fixed into the microphone module 821. One surface of the microphone 8211 may be referred to as a sound wave receiving part 8213 which receives the sound wave, and the sound wave receiving part 8213 is disposed toward an opening 8214 of the microphone accommodation part 8212. The other side of the microphone 8211 may be connected to a signal line 8216, and the signal line 8216 may also be connected to the detection device PCB 83.

The microphone accommodation part 8212 is formed of an elastic material such as rubber, and also formed to be in close contact with the front panel 541. To this end, the opening 8214 may be formed at one side of the microphone accommodation part 8212 close to the microphone 8211 installed in the microphone accommodation part 8212, and a circular protrusion 8215 may be formed at a circumference of the opening 8214. The protrusion 8215 serves to enable the microphone accommodation part 8212 not to be inclined in one direction when the microphone accommodation part 8212 is in close contact with the front panel 541, and also to enable an entire opened front surface of the opening part 403 to be maintained in a closely contacting state with the front panel 541.

A predetermined sealed space may be formed between the opening 8214 and the sound wave receiving part 8213 which are in close contact with each other by the protrusion 8215. Therefore, a front of the closely contacting space is sealed by a medium, i.e., the front panel 541. Accordingly, vibration transmitted through an inside of the medium vibrates air in the predetermined space, and the sound wave due to the vibration may be received by the microphone 8211.

Due to such a sealing process, introduction of external noise or vibration into the predetermined space may be minimized. Thus, an error in determining a knock-on operation or a malfunction due to the external noise may be considerably reduced, and very accurate recognition rate may be ensured. That is, accuracy in determining the knock-on operation when a knock-on input is applied may be remarkably increased.

A module seating part 8231 in which the microphone module 821 is accommodated and which is opened toward the front panel 541 may be formed at the holder 823. The microphone module 821 may be formed so that at least the protrusion 8215 protrudes further than a front surface of the holder 823 while the microphone module 821 is seated on the module seating part 8231.

A holder slot 8232 through which the signal line connected to the microphone 8211 passes is formed at the holder 823. The holder slot 8232 is formed to be opened at one side of the module seating part 8231.

Also, a first elastic member fixing part 8233 which protrudes so that the elastic member 824 is installed and fixed thereto is formed at a rear surface of the holder 823. The first elastic member fixing part 8233 may be formed to extend and to pass through one end of the elastic member 824 having a coil shape.

A holder coupling part 8234 which is formed in a hook shape and coupled to the support member 825 is formed at both sides of the holder 823. Due to the holder coupling part 8234, the holder 823 is coupled so as not to be separated by the support member 825. And also, due to the hook shape of the holder coupling part 8234, movement of the holder 823 in a direction which is inserted into the support member 825 is not restricted.

A front surface of the support member 825 is formed to be opened, and also formed so that the holder 823 is inserted through the opened front surface thereof. And a second elastic member fixing part 8251 which protrudes so that the elastic member 824 is installed and fixed thereto may be formed at an inside of the holder 823. The second elastic member fixing part 8251 may be located on an extension line of the first elastic member fixing part 8233, and may be inserted so as to pass through one end of the elastic member 824.

Therefore, even though the elastic member 824 is compressed to press the holder 823, the elastic member 824 may stably press the holder 823 toward the front panel 541 without being buckled.

By the elastic member 824, the microphone module 821 may be maintained in a closely contacting state with the front panel 541, and particularly, may be always maintained in the closely contacting state with the front panel 541 without a position change of the microphone module 821 due to a shock generated when the main door 40 and the sub-door 50 are closed and opened or an inertial force generated when the main door 40 and the sub-door 50 are rotated.

A support member slot 8252 may be formed at one side of the support member 825. The support member slot 8252 may be formed on an extension line of the holder slot 8232. Therefore, the signal line passing through the holder slot 8232 may pass through the support member slot 8252, and may be connected to the detection device PCB 83.

A support member fixing part 8254 is formed at the other side of the support member 825. The support member fixing part 8254 may be formed to extend outward, and may be installed and fixed to a detecting device coupling boss 5874 formed on the accommodating part case 587 by a screw. The detecting device coupling boss 5874 is formed to be exposed through the sensor opening 584, and enables the knock detection device 82 to be installed and fixed through the sensor opening 584 after the knock detection device 82 is inserted.

The knock detection device 82 is located at the edge of the front panel 541, but an effective input part for the user's knocking operation is not limited to this configuration. In a state in which the knock detection device 82 is in close contact with the medium, even though the knocking operation is applied to any positions, the sound wave may be transmitted through the continuous same medium due to a property of the microphone 8211 which detects the sound wave generated by the vibration, instead of the vibration itself, and thus may be effectively detected. Therefore, a position of the knock detection device 82 may be disposed at one end at which the electric wires may be arranged and a visible area of the sub-door 50 may also be maximized. At the same time, even though the user knocks on any point of the front panel 541, the sound wave may be detected through the microphone 8211 which is in close contact with the same medium.

Specifically, an area to which a user's knocking input is applied may be an entire area which is defined by the front surface of the front panel 541. Most of the front panel 541 except a boundary portion thereof is a see-through area which selectively becomes transparent, and the knock detection device 82 may not be disposed thereat.

Therefore, it is preferable that the knock detection device 82 is located at the area of the bezel 5411 in the front panel 541. In particular, the bezel 5411 located at the upper end and left and right sides of the front panel 541 may be minimized by locating the knock detection device 82 at the lower end of the front panel 541 rather than both of the left and right sides thereof. By such a shape of the bezel 5411, the see-through area may be expanded. Since the knock detection device 82 is located at the lower end of the front panel 541 on which a user's eyes are relatively less focused, the wider see-through area may be provided to the user.

Since the knock detection device 82 is located at the area of the bezel 5411, is not exposed to an outside, and has a structure which is in close contact with the front panel 541, the user's knocking operation may be detected even through the user knocks on any position of the front panel 541.

The front surface of the panel assembly 54 may be vibrated by the shock generated when the main door 40 and the sub-door 50 are opened and closed, an external loud noise or the like, and such an input due to the external environments may be recognized as a knock signal.

The detection device PCB 83 may be set so that a user's operation which knocks several times the front surface of the panel assembly 54 may be recognized as a normal knock input. More specifically, the user's operation which knocks several times the front surface of the panel assembly 54 at predetermined time intervals may be recognized as the normal knock input.

For example, when the user knocks twice the front surface of the panel assembly 54 within a predetermined time, it may be recognized as the normal knock input.

The door opening assist device 588 is provided at the lower portion of the door liner 58. The door opening assist device 588 may include an elastic member accommodation part 5881 which is recessed inside the door liner 58, an elastic member 5882 which is accommodated in the elastic member accommodation part 5881, and a pressing member 5883 which is supported by the elastic member 5882.

Figure 33:
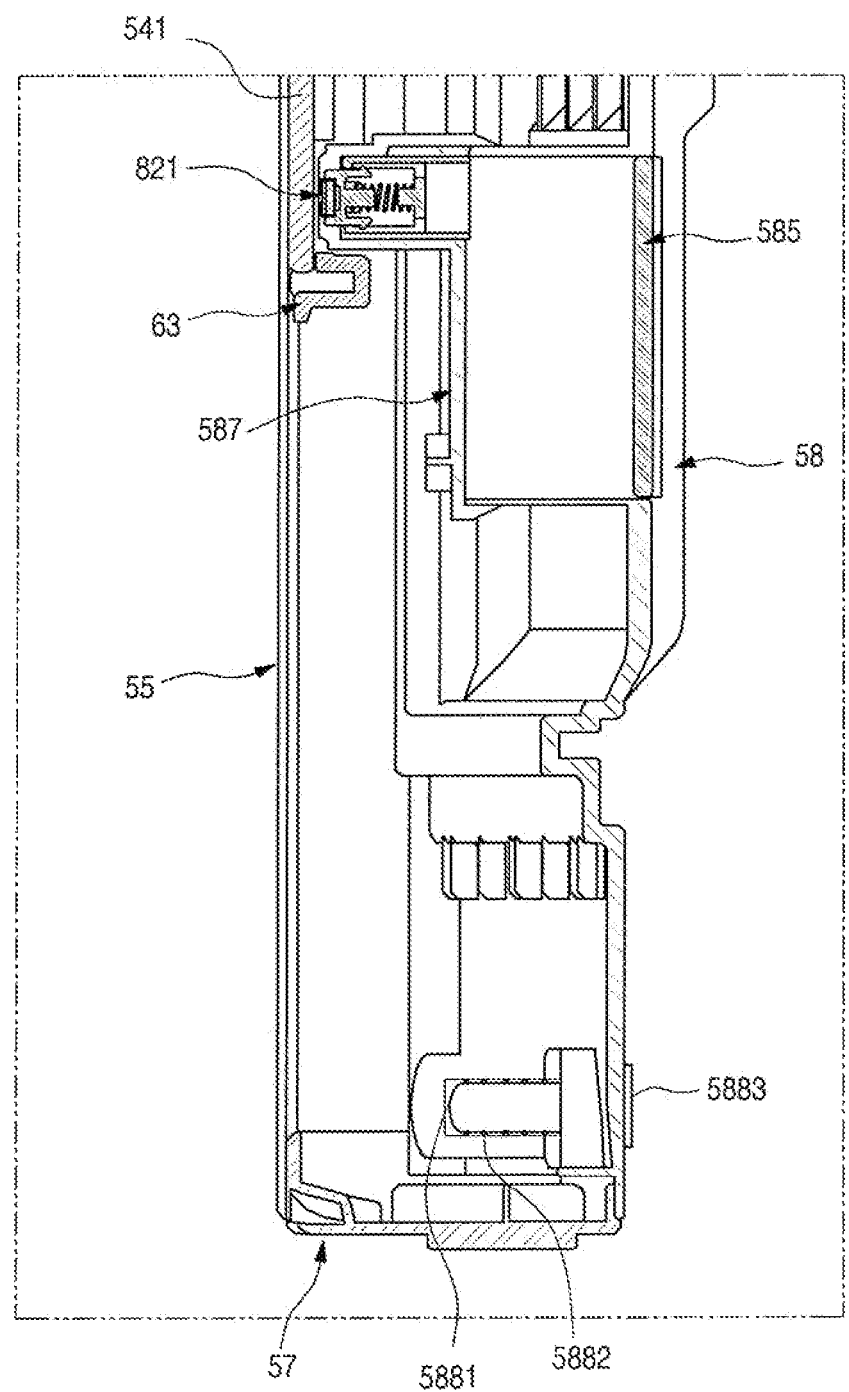
FIG. 33 is a cross-sectional view taken along line 33-33' of FIG. 12.
Figure 34:
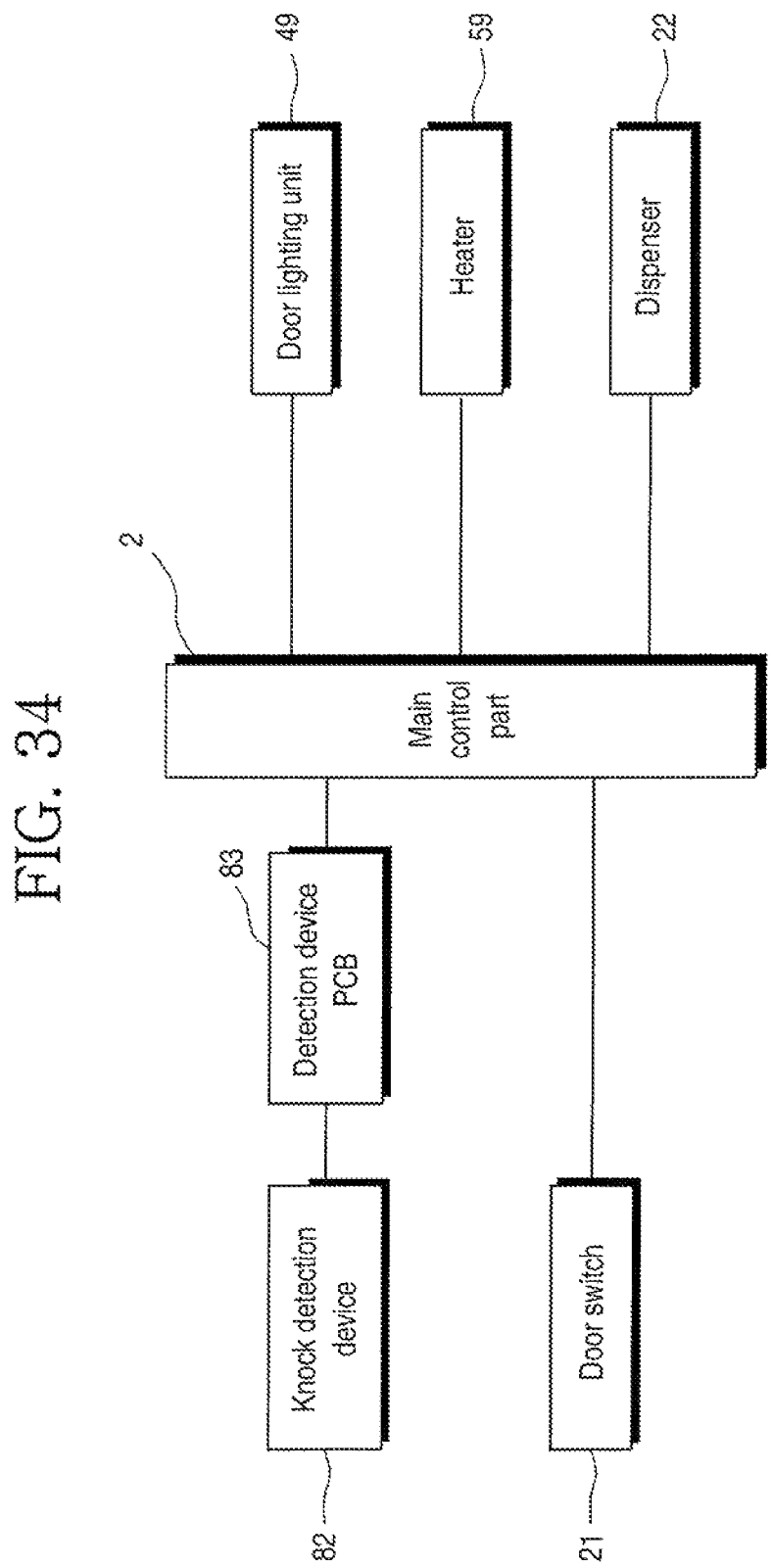
FIG. 34 is a block diagram illustrating a flow of a control signal of the refrigerator.
Figure 35:
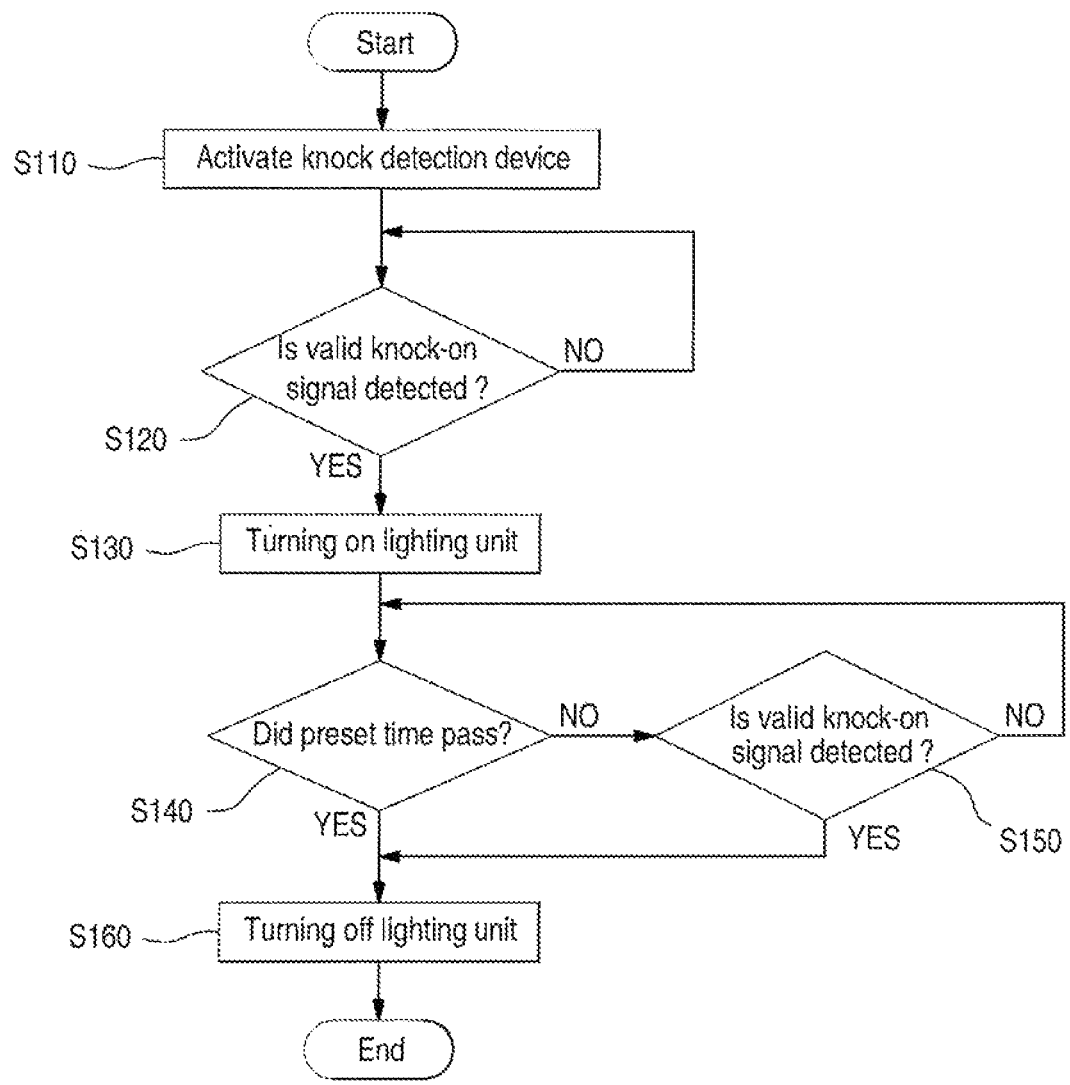
FIG. 35 is a flowchart sequentially illustrating an operation of the sub-door of the refrigerator.

While an external force is not applied, the pressing member 5883 is supported by the elastic member 5882, and protrudes from the door liner 58, as illustrated in FIG. 33. Therefore, when the sub-door 50 is closed, the pressing member 5883 becomes in contact with the main door 40, and compresses the elastic member 5882. When the user operates the operating button 231 of the handle 23 to open the sub-door 50 while the sub-door 50 is closed, the coupling between the locking unit 232 and the restricting member 404 is released, and the sub-door 50 is rotated and opened by an elastic force of the elastic member 5882.

As illustrated in FIGS. 34-37, the refrigerator 1 includes the main control part 2 which controls the operation of the refrigerator 1, and the main control part 2 may be connected to a door switch 21. The door switch 21 may be provided at the cabinet 10, and may detect opening of the refrigerator compartment door 20 or the main door 40, and may also be provided at the main door 40, and may detect opening of the sub-door 50.

The main control part 2 may be connected to the door lighting unit 49, and may enable the door lighting unit 49 to be turned on when the sub-door 50 is opened or the knock-on signal is input. The main control part 2 may be connected to the detection device PCB 83 which is connected to the knock detection device 82.

Figure 36:
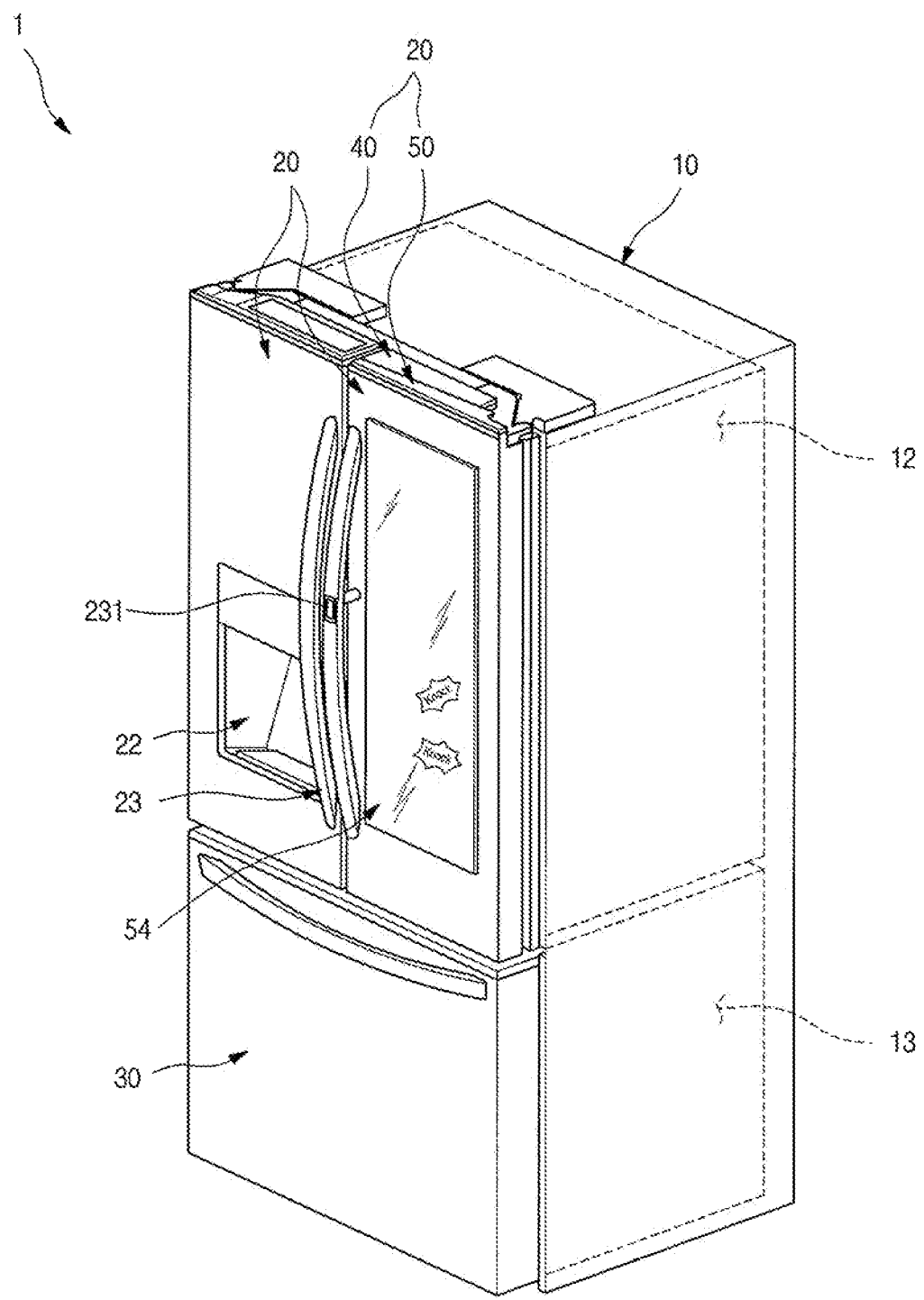
FIG. 36 is a perspective view illustrating a state before an knocking operation in the refrigerator.

In a general state in which a separate operation is not applied to the refrigerator 1, the panel assembly 54 is in the opaque state like the mirror surface, as illustrated in FIG. 36. In this state, it is impossible to see through the inside of the refrigerator.

In this state, the knock detection device 82 is maintained in an activated state in which the user may input the operation anytime [S110].

In this state, when the user performs a knock-on operation which knocks on the front surface of the sub-door 50, i.e., the front panel 541 to check a food storing state in the refrigerator, the knock detection device 82 may detect the knock-on operation, and the detection device PCB 83 determines whether the knock-on operation is valid.

Specifically, when the user knocks on the front panel 541, the sound wave due to the vibration generated at this point is transmitted along the front panel 541 formed of the same medium, and the microphone 8211 which is in close contact with the front panel 541 receives the sound wave.

The received sound wave is filtered and amplified while passing through a filter and an amplifier, and transmitted to the detection device PCB 83. The detection device PCB 83 determines the knock with the signal which is collected and analyzed to detect the knock signal.

That is, in the case of the sound wave which is generated by the noise or the shock inside or outside the refrigerator 1, there is a difference from the sound wave generated by the knocking operation in a property thereof, and thus the detection device PCB 83 determines whether the user performs the knocking operation through the signal corresponding to the property of the knock signal.

In a specific situation, a signal similar to the knock signal may be generated, or a shock similar to the knock may be applied to the front panel 541 due to the user's carelessness or inexperienced operation, or the external noise may be recognized as a signal similar to a wavelength of the knock signal.

When the main door 40 or the sub-door 50 is opened, the knock detection device 82 may be deactivated, or may ignore the input signal, and thus the malfunction may be prevented [S120].

Meanwhile, when the valid knock-on signal is detected, and the detection device PCB 83 transmits the valid signal to the main control part 2, the main control part 2 turns on the door lighting unit 49.

Figure 37:
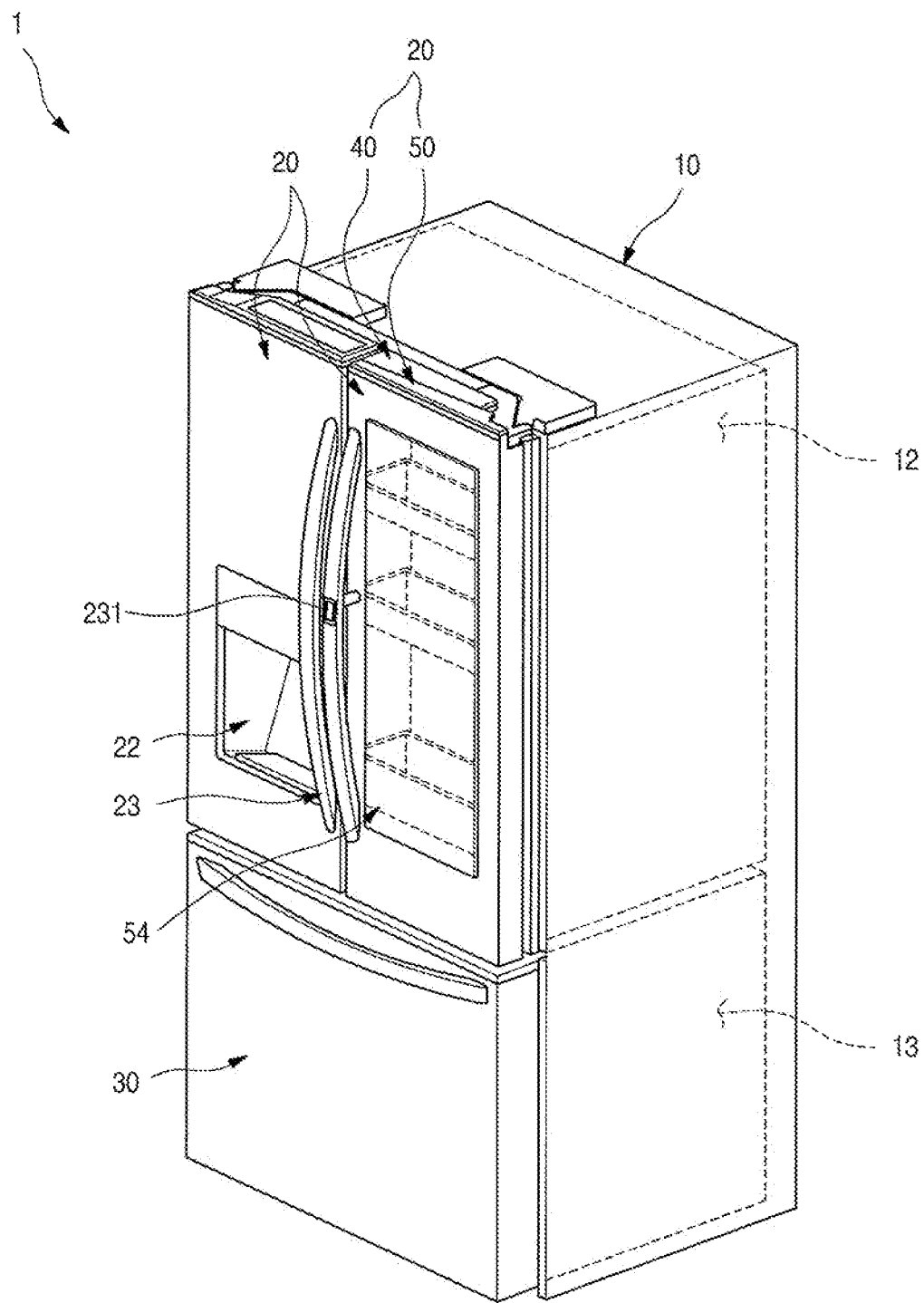
FIG. 37 is a perspective view illustrating a state after the knocking operation in the refrigerator.

When the door lighting unit 49 is turned on, the inside of the opening part 403 becomes bright, and the light inside the refrigerator passes through the panel assembly 54. In particular, when the light passes through the front panel 541, the front panel 541 becomes transparent, and thus the inside thereof may be seen through, as illustrated in FIG. 37.

When the sub-door 50 becomes transparent, the user may confirm the accommodation space inside the main door 40 or the space inside the refrigerator, and thus may open the sub-door 50 to store the food, or may perform a necessary operation [S130].

The turned-on door lighting unit 49 may be maintained in a turned-on state for a preset time, e.g., 10 seconds, and thus may allow the user to sufficiently confirm an internal state of the refrigerator 1.

When the present time passes, the door lighting unit 49 is turned off [S140].

While the door lighting unit 49 is turned on, a valid knock-on operating signal may be input by the user before the preset time passes.

That is, when the user performs the knocking operation to confirm the inside the refrigerator 1, but a separate operation is not needed, the door lighting unit 49 may be turned off before the preset time passes.

For example, in a state in which the user confirms an accommodation state inside the refrigerator 1 within 5 seconds after the door lighting unit 49 is turned on, when it is intended that the sub-door 50 becomes opaque, the knocking operation may be performed again on the front surface of the sub-door 50, i.e., the front panel 541.

At this point, when it is determined that the knocking operation is valid, the door lighting unit 49 may be turned off before the preset time passes. Of course, validity determination of the knocking operation may be set to be the same as the operation S120, and if necessary, may be set to another knock input pattern [S150].

When the preset time passes after the door lighting unit 49 is turned on, or the valid knock-on signal is input, the door lighting unit 49 may be turned off.

When the door lighting unit 49 is turned off, the inside of the refrigerator 1 becomes dark, and the outside thereof is in a bright state. In this state, the light outside the refrigerator 1 is reflected by the front panel 541, and thus the front surface of the sub-door 50 is in a mirror-like state, and the user may not see through the inside thereof. Therefore, the sub-door 50 is maintained in the opaque state until a new operation is input [S160].

What is claimed is:

1. A refrigerator, comprising:
   a cabinet having a storage chamber; and
   a door configured to open and close the storage chamber, wherein the door comprises:
   an outer plate formed of a metal material and having a front surface defining a first exterior of the door and a plate bent part bent rearward along a perimeter of an opening formed at a center portion of the outer plate;
   a front panel formed of a glass material and inserted into the opening, the front panel having a front surface defining a second exterior of the door and a side surface that faces the plate bent part;
   a bezel that extends along a perimeter of a rear surface of the front panel to restrict transmission of light;
   a door liner spaced apart from the outer plate and having a rear surface defining a third exterior of the door;
   a door frame configured to connect the outer plate to the door liner, at least one of an upper surface or a rear surface of the door frame defining a fourth exterior of the door; and
   an insulation filled in an insulating space defined by the outer plate, the door liner, the door frame, and the front panel, wherein the first exterior, the second exterior, and the bezel are viewable at a front side of the refrigerator in a state in which the door closes the storage chamber.

2. The refrigerator of claim 1, wherein an extension length of the plate bent part is greater than a thickness of the front panel.

3. The refrigerator of claim 1, wherein the bezel is disposed behind the front surface of the outer plate.

4. The refrigerator of claim 1, wherein the bezel is disposed in a region defined by the plate bent part.

5. The refrigerator of claim 1, wherein the insulation is in contact with the plate bent part.

6. The refrigerator of claim 1, wherein the door frame comprises a plurality of injection holes spaced apart from each other through which a foaming solution which forms the insulation is injected.

7. The refrigerator of claim 1, further comprising a door lighting unit provided in the door.

8. The refrigerator of claim 7, wherein a brightness of the second exterior of the door when the door lighting unit is turned on is greater than a brightness of the second exterior of the door when the door lighting unit is turned off.

9. The refrigerator of claim 1, further comprising a detector to detect an input signal applied to the front panel, wherein the detector faces the bezel.

10. The refrigerator of claim 1, wherein the door further comprises a heater that faces the bezel.

11. The refrigerator of claim 10, wherein the heater is disposed in a region defined by the plate bent part.

12. A refrigerator, comprising:
    a cabinet having a storage chamber; and
    a door configured to open and close the storage chamber, wherein the door comprises:
    an outer plate formed of a metal material and having a front surface defining a first exterior of the door and a plate bent portion that extends rearward perpendicular to the front surface along a perimeter of an opening formed at a center portion of the outer plate;
    a front panel formed of a glass material and inserted into the opening, the front panel having a front surface defining a second exterior of the door and a side surface that faces the plate bent portion;
    a bezel that extends along a perimeter of a rear surface of the front panel to restrict transmission of light, wherein the bezel is disposed in a region defined by the plate bent portion;
    a door liner spaced apart from the outer plate and having a rear surface defining a third exterior of the door;
    a door frame configured to connect the outer plate to the door liner, at least one of an upper surface or a rear surface of the door frame defining a fourth exterior of the door; and
    an insulation filled in an insulating space defined by the outer plate, the door liner, the door frame, and the front panel, wherein the first exterior, the second exterior, and the bezel are viewable at a front side of the refrigerator in a state in which the door closes the storage chamber.

13. The refrigerator of claim 12, wherein an extension length of the plate bent part is greater than a thickness of the front panel.

14. The refrigerator of claim 12, wherein the bezel is disposed behind the front surface of the outer plate.

15. The refrigerator of claim 12, wherein the insulation is in contact with the plate bent portion.

16. The refrigerator of claim 12, wherein the door frame comprises a plurality of injection holes spaced apart from each other through which a foaming solution which forms the insulation is injected.

17. The refrigerator of claim 12, further comprising a door lighting unit provided in the door.

18. The refrigerator of claim 17, wherein a brightness of the second exterior of the door when the door lighting unit is turned on is greater than a brightness of the second exterior of the door when the door lighting unit is turned off.

19. The refrigerator of claim 12, further comprising a detector to detect an input signal applied to the front panel, wherein the detector faces the bezel.

20. The refrigerator of claim 12, wherein the door further comprises a heater that faces the bezel, wherein the heater is disposed in a region defined by the plate bent portion.

* * * * *